US011368384B2

(12) United States Patent
Dalal

(10) Patent No.: US 11,368,384 B2
(45) Date of Patent: Jun. 21, 2022

(54) DETECTING AND LOCATING PROCESS CONTROL COMMUNICATION LINE FAULTS FROM A HANDHELD MAINTENANCE TOOL

(71) Applicant: FISHER-ROSEMOUNT SYSTEMS, INC., Round Rock, TX (US)

(72) Inventor: Mehul Rajeshbhai Dalal, Pune (IN)

(73) Assignee: FISHER-ROSEMOUNT SYSTEMS, INC., Round Rock, TX (US)

( * ) Notice: Subject to any disclaimer, the term of this patent is extended or adjusted under 35 U.S.C. 154(b) by 0 days.

(21) Appl. No.: 16/451,453

(22) Filed: Jun. 25, 2019

(65) Prior Publication Data
US 2019/0312803 A1    Oct. 10, 2019

Related U.S. Application Data

(62) Division of application No. 15/136,058, filed on Apr. 22, 2016, now Pat. No. 10,382,312.

(30) Foreign Application Priority Data

Mar. 2, 2016    (IN) .............................. 201621007393

(51) Int. Cl.
*H04L 12/26* (2006.01)
*H04L 43/50* (2022.01)
(Continued)

(52) U.S. Cl.
CPC .......... *H04L 43/50* (2013.01); *H04L 41/0677* (2013.01); *G01R 31/08* (2013.01); *H04L 43/0823* (2013.01)

(58) Field of Classification Search
CPC . G08B 21/182; H04L 41/0677; H04L 43/045; H04L 43/0823; H04L 43/50;
(Continued)

(56) References Cited

U.S. PATENT DOCUMENTS

| 5,461,318 A | 10/1995 | Borchert et al. |
| 5,537,327 A | 7/1996 | Snow et al. |

(Continued)

FOREIGN PATENT DOCUMENTS

| CN | 1786726 A | 6/2006 |
| CN | 101410800 A | 4/2009 |

(Continued)

OTHER PUBLICATIONS

Wright et al., "4 The public switched telephone network (PSTN)", 2004, Elsevier Ltd, Total pp. 21 (Year: 2004).*

(Continued)

*Primary Examiner* — Shah M Rahman
(74) *Attorney, Agent, or Firm* — Marshall, Gerstein & Borun LLP

(57) ABSTRACT

A handheld maintenance tool operates to detect the existence of a fault in a communication line or bus, including detecting short circuit or other low impedance faults, open circuit or other high impedance faults, etc. Additionally, the handheld maintenance tool may operate to detect an approximate location of a fault within the communication line with respect to the handheld device, to thereby enable an operator or maintenance person to more easily find and repair a detected fault.

25 Claims, 6 Drawing Sheets

(51) Int. Cl.
*H04L 41/0677* (2022.01)
*H04L 43/0823* (2022.01)
*G01R 31/08* (2020.01)

(58) Field of Classification Search
CPC .......... G01R 31/08; G01R 31/11; G01R 3/00;
G01R 31/281; G05B 23/0256; G05B
2219/21162; H04B 17/17; H04B 17/104;
H04B 10/0771; H04B 17/318
See application file for complete search history.

(56) References Cited

U.S. PATENT DOCUMENTS

| | | | |
|---|---|---|---|
| 5,999,740 A | 12/1999 | Rowley | |
| 6,035,423 A | 3/2000 | Hodges et al. | |
| 6,058,161 A | 5/2000 | Anderson et al. | |
| 6,282,709 B1 | 8/2001 | Reha et al. | |
| 6,377,859 B1* | 4/2002 | Brown | G05B 23/0256 700/79 |
| 6,629,059 B2 | 9/2003 | Borgeson et al. | |
| 6,718,271 B1 | 4/2004 | Tobin | |
| 6,795,402 B1* | 9/2004 | Richardson | H04L 43/18 370/241 |
| 6,889,166 B2 | 5/2005 | Zielinski et al. | |
| 7,010,294 B1 | 3/2006 | Pyotsia et al. | |
| 7,016,741 B2 | 3/2006 | Arntson | |
| 7,177,122 B2 | 2/2007 | Hou et al. | |
| 7,227,656 B1 | 6/2007 | Kato | |
| 7,254,217 B2 | 8/2007 | Rude et al. | |
| 7,271,596 B2* | 9/2007 | Furse | G01R 31/11 324/533 |
| 7,289,994 B2 | 10/2007 | Nixon et al. | |
| 7,328,078 B2 | 2/2008 | Sanford et al. | |
| 7,421,531 B2 | 9/2008 | Rotvold et al. | |
| 7,539,978 B1 | 5/2009 | Haddox et al. | |
| 7,620,948 B1 | 11/2009 | Rowe et al. | |
| 7,630,861 B2 | 12/2009 | Longsdorf et al. | |
| 7,675,932 B2 | 3/2010 | Schumacher | |
| 7,835,295 B2 | 11/2010 | Brewer et al. | |
| 7,840,296 B2 | 11/2010 | Sanford et al. | |
| 7,844,365 B2 | 11/2010 | Brewer et al. | |
| 7,975,266 B2 | 7/2011 | Schneider et al. | |
| 8,055,371 B2 | 11/2011 | Sanford et al. | |
| 8,102,779 B2 | 1/2012 | Kim | |
| 8,127,241 B2 | 2/2012 | Blevins et al. | |
| 8,204,717 B2 | 6/2012 | McLaughlin et al. | |
| 8,286,154 B2 | 10/2012 | Kaakani et al. | |
| 8,411,575 B2* | 4/2013 | Karam | H04L 12/10 370/241 |
| 8,458,659 B2 | 6/2013 | Resnick et al. | |
| 8,626,916 B2 | 1/2014 | Armstrong et al. | |
| 8,766,794 B2 | 7/2014 | Ferguson et al. | |
| 9,003,387 B2 | 4/2015 | Van Camp et al. | |
| 9,244,455 B2 | 1/2016 | Peterson et al. | |
| 9,383,735 B2 | 7/2016 | Schweitzer, III et al. | |
| 9,429,613 B1* | 8/2016 | Borchert | G01R 31/11 |
| 9,880,212 B2* | 1/2018 | Weindl | G01R 31/58 |
| 2002/0167904 A1* | 11/2002 | Borgeson | G05B 23/0213 370/241 |
| 2002/0194547 A1* | 12/2002 | Christensen | G06F 11/3055 714/43 |
| 2003/0048756 A1 | 3/2003 | Chang et al. | |
| 2004/0039458 A1 | 2/2004 | Mathiowetz et al. | |
| 2004/0073402 A1* | 4/2004 | DelaCruz | H04L 43/18 702/183 |
| 2004/0114752 A1 | 6/2004 | Rude et al. | |
| 2004/0181787 A1 | 9/2004 | Wickham et al. | |
| 2004/0230401 A1 | 11/2004 | Duren et al. | |
| 2005/0132349 A1 | 6/2005 | Roberts et al. | |
| 2005/0228798 A1 | 10/2005 | Shepard et al. | |
| 2005/0284102 A1 | 12/2005 | Herzog | |
| 2006/0018449 A1* | 1/2006 | Stevens | H04M 7/0057 379/93.05 |
| 2006/0061368 A1* | 3/2006 | Furse | G01R 31/11 324/519 |
| 2006/0198211 A1 | 9/2006 | Frankowsky | |
| 2007/0004168 A1 | 1/2007 | Zips | |
| 2007/0022403 A1 | 1/2007 | Brandt et al. | |
| 2007/0118699 A1 | 5/2007 | Synard et al. | |
| 2007/0169079 A1 | 7/2007 | Keller et al. | |
| 2007/0185588 A1 | 8/2007 | El-Sayed | |
| 2008/0040449 A1 | 2/2008 | Grant et al. | |
| 2008/0048668 A1* | 2/2008 | Mashikian | G01R 31/1272 324/533 |
| 2008/0049984 A1 | 2/2008 | Poo et al. | |
| 2008/0075012 A1* | 3/2008 | Zielinski | H04L 12/42 370/241 |
| 2008/0126005 A1 | 5/2008 | Guenter et al. | |
| 2008/0268784 A1 | 10/2008 | Kantzes et al. | |
| 2009/0094462 A1 | 4/2009 | Madduri | |
| 2009/0133012 A1 | 5/2009 | Shih | |
| 2009/0138870 A1 | 5/2009 | Shahindoust et al. | |
| 2009/0320125 A1 | 12/2009 | Pleasant, Jr. et al. | |
| 2010/0052693 A1* | 3/2010 | Wang | H04M 3/085 324/533 |
| 2010/0146497 A1 | 6/2010 | Kogan et al. | |
| 2010/0188095 A1* | 7/2010 | Maslen | G01R 31/11 324/533 |
| 2011/0031977 A1* | 2/2011 | O'Sullivan | G01R 31/088 324/522 |
| 2011/0087461 A1 | 4/2011 | Hollander et al. | |
| 2011/0127854 A1 | 6/2011 | Cruz et al. | |
| 2011/0224808 A1 | 9/2011 | Lucas et al. | |
| 2012/0038760 A1 | 2/2012 | Kantzes et al. | |
| 2013/0024495 A1 | 1/2013 | Armstrong et al. | |
| 2013/0070745 A1 | 3/2013 | Nixon et al. | |
| 2013/0214898 A1 | 8/2013 | Pineau et al. | |
| 2013/0229735 A1 | 9/2013 | Rostron | |
| 2014/0018955 A1 | 1/2014 | Asakawa et al. | |
| 2014/0019768 A1 | 1/2014 | Pineau et al. | |
| 2014/0047107 A1 | 2/2014 | Maturana et al. | |
| 2014/0056173 A1 | 2/2014 | Nakamura et al. | |
| 2014/0181955 A1 | 6/2014 | Rosati | |
| 2014/0273847 A1 | 9/2014 | Nixon et al. | |
| 2014/0282227 A1 | 9/2014 | Nixon et al. | |
| 2014/0336959 A1 | 11/2014 | Thomas et al. | |
| 2015/0005970 A1 | 1/2015 | Zweigle et al. | |
| 2015/0024710 A1 | 1/2015 | Becker et al. | |
| 2015/0098158 A1 | 4/2015 | Kemp et al. | |
| 2015/0281227 A1 | 10/2015 | Fox Ivey et al. | |
| 2016/0026813 A1 | 1/2016 | Neitzel et al. | |
| 2016/0061349 A1 | 3/2016 | Shields | |
| 2016/0132046 A1 | 5/2016 | Beoughter et al. | |
| 2016/0154394 A1 | 6/2016 | Peterson et al. | |
| 2016/0299175 A1 | 10/2016 | Dewey et al. | |
| 2016/0370419 A1 | 12/2016 | Poluru et al. | |
| 2017/0078265 A1 | 3/2017 | Sundaresh et al. | |
| 2017/0257378 A1 | 9/2017 | Sprenger et al. | |
| 2017/0336444 A1 | 11/2017 | Sela | |

FOREIGN PATENT DOCUMENTS

| | | |
|---|---|---|
| CN | 101726692 A | 6/2010 |
| CN | 102455399 A | 5/2012 |
| CN | 103019094 A | 4/2013 |
| CN | 103548304 A | 1/2014 |
| CN | 103760467 A | 4/2014 |
| CN | 203981821 U | 12/2014 |
| EP | 1 816 530 A1 | 8/2007 |
| EP | 1 906 623 A1 | 4/2008 |
| EP | 2 026 223 A2 | 2/2009 |
| EP | 2 067 088 A2 | 6/2009 |
| EP | 2 782 073 A1 | 9/2014 |
| GB | 1 517 768 A | 7/1978 |
| GB | 2 465 495 A | 5/2010 |
| GB | 2 496 121 A | 5/2013 |
| GB | 2 535 839 A | 8/2016 |
| GB | 2 539 311 A | 12/2016 |
| GB | 2 548 007 A | 9/2017 |
| JP | 2002-007129 A | 1/2002 |
| JP | 2004-234056 A | 8/2004 |

(56) References Cited

FOREIGN PATENT DOCUMENTS

| JP | 2009-187420 A | 8/2009 |
|---|---|---|
| WO | WO-2008/045258 A2 | 4/2008 |
| WO | WO-2013/184117 A1 | 12/2013 |
| WO | WO-2016/020165 A1 | 2/2016 |
| WO | WO-2017/085923 A1 | 5/2017 |

OTHER PUBLICATIONS

Examiners Note, Total pp. 9 (Year: 2021).*
"FieldConnex® DTM Collection DTM FieldConnex," Pepperla Fuchs (2017). Retrieved from the Internet at <URL:http://www.pepperl-fuchs.com/qlobal/en/classid_1804.htm?view=productdetails&prodid=32801>.
"From the Very First Click—Mobile Fieldbus Diagnostics at the Touch of a Button," Pepperl Fuchs (2017). Retrieved from the Internet at <URL:http://www.pepperl-fuchs.com/global/en/26002.htm>.
"Simplify Processes FieldConnex®—Infrastructure for Foundation™ Fieldbus," Pepperl Fuchs (2012). Retrieved from the Internet at <URL:http://www.pfsolutions.info/FieldConnex/pdf/simplify_processes-fieldconnex-infrastructure_for_foundation-fieldbus.pdf>.
"Simplify Processes FieldConnex®—Infrastructure for Profibus PA," Pepperl Fuchs (2012). Retrieved from the Internet at <URL:http://www.momentum-automation.com/tekstovi%20i%20reklame/PA%20(System%20Catalogue)%20tdoct0688c_eng.pdf>.
Agilient et al., "Tiem Domain Reflectometry Theory," Agilient Technologies, pp. 1-16 (2006).
Beamex MC5 (discontinued) description, Retrieved from the internet at http://www.beamex.com/beamex_products/MC5-%28discounted%29/na15ghgl/355ca6b7-66ff-469f-9bd4-1f26c0870452#Features> (Jul. 8, 2016).
Beamex MC6 Advanced Field Calibrator and Communicator, Product Brochure (2016).
Bosgaerd, "Connecting Fieldbus Power and Knowledge," Pepperl Fuchs (Retreived from the Internet at <URL:http://www.regeltechniek.org/artikels/veldbus/Fieldconnex_vik_presentatie_150604.pdf>.
Costall, "Essential Concepts of Intrinsic Safety," Spark Institute. Retrieved from the internet at <http://www.sparkinstitute.ca/wp/WP00_-_EssentialConcepts_of_Intrinsic_Safety.pdf> (May 24, 2016).
Emerson Process Management, "475 Field Communicator." Retrieved from the internet at <http://www2.emersonprocess.com/siteadmincenter/PM%20Asset%20Optimization%20Documents/ProductReferenceAndGuides/475_ru_usermanual.pdf> (May 26, 2016).
Examination Report Under Section 18(3) in Application No. GB1015879.8, dated Mar. 13, 2014.
Examination Report Under Section 18(3) in Application No. GB1015879.8, dated Mar. 20, 2015.
Examination Report under Section 18(3) dated Oct. 2, 2014 in Application No. GB1015879.8, 3 pgs.
Fieldbus Engineer's Guide, Pepperl+Fuchs (May 2013), 474 pages.
Fieldbus Foundation, "Foundation Fieldbus Application Guide; 31,25 kbit/s Intrinsically Safe Systems." Retrieved from the internet at <http://www.fieldbus.org/images/stories/enduserresources/technicalreferences/documents/instrinsciallysafesystems.pdf> (May 26, 2016).
First Office Action for corresponding Chinese Patent Application No. 201010572412.4, dated Jun. 5, 2014, 8 pgs.
Fluke 709 Precision Loop Calibrator, User Manual, © 2013 Fluke Corporation.
Fluke 709/709H Precision Loop Calibrator, Quick Reference Guide (2013).
GE Measurement & Control Systems, Druck DPI 620-IS advanced modular calibrator user manual, © Druck Limited 2010.
Office Action for corresponding Japanese Patent Application No. 2010-215391, dated Aug. 19, 2014, 4 pgs.
Omega, "Digital Signal Transmission." Retrieved from the internet at <https://www.omega.com/literature/transactions/volume2/digitalsignal4.html> (May 26, 2016).
Omega, "Understanding What's Meant by Intrinsically Safe." Retrieved from the internet at < http://www.omega.com/technical-learning/understanding-what-is-meant-by-intrinsically-safe.html> (May 26, 2016).
Search Report for Application No. GB1015879.8, dated Jan. 13, 2011.
Search Report for Application No. GB1702053.8, dated Jun. 30, 2017.
Search Report for Application No. GB1709952.4, dated Nov. 29, 2017.
Search Report for Application No. GB1710027.2, dated Oct. 19, 2017.
Search Report for Application No. GB1710029.8, dated Dec. 21, 2017.
Search Report for Application No. GB1710117.1, dated Oct. 23, 2017.
Search Report for Application No. GB1710119.7, dated Oct. 24, 2017.
Search Report for Application No. GB1710124.7, dated Oct. 20, 2017.
Search Report for Application No. GB1710125.4, dated Oct. 12, 2017.
Search Report for Application No. GB1710210.4, dated Oct. 26, 2017.
Search Report for Application No. GB1710211.2, dated Nov. 30, 2017.
Search Report for Application No. GB1710266.6, dated Dec. 19, 2017.
Search Report for Application No. GB1711106.3, dated Nov. 21, 2017.
U.S. Appl. No. 14/682,714, filed Apr. 9, 2015.
U.S. Appl. No. 15/214,949, filed Jul. 20, 2016.
U.S. Appl. No. 15/214,975, filed Jul. 20, 2016.
U.S. Appl. No. 15/216,810, filed Jul. 22, 2016.
User Manual for Beamex® MC6 Advanced Field Calibrator and Communicator (2012-2015).
Wikipedia, "Intrinsic Safety." Retrieved from the internet at <https://en.wikipedia.org/wiki/Intrinsic_safety> (May 24, 2016).
Wiring and Installation 31.25 kbit/s, Voltage Mode, Wire Medium, Application Guide, Foundation™ Fieldbus, © 1996 Fieldbus Foundation.
First Examination Report for India Application No. 201621007393, dated Apr. 29, 2020.
Notification of the First Office Action for Chinese Application No. 201710121078.2, dated Aug. 28, 2020.
First Examination Report for India Application No. 202022045509, dated Nov. 25, 2021.
Combind Search and Examination Report for Application No. GB2200615.9, dated Apr. 6, 2022.

* cited by examiner

DETECTING AND LOCATING PROCESS CONTROL COMMUNICATION LINE FAULTS FROM A HANDHELD MAINTENANCE TOOL

CROSS-REFERENCE TO RELATED APPLICATIONS

This application is a divisional of U.S. patent application Ser. No. 15/136,058, entitled "Detecting and Locating Process Control Communication Line Faults from a Handheld Maintenance Tool," and filed on Apr. 22, 2016, the entire disclosure of which is hereby incorporated by reference herein.

FIELD OF TECHNOLOGY

The present application relates to a diagnostic handheld maintenance tool that selectively provides power and communication signals to one or more field devices on a communication line and, in particular, to a handheld maintenance tool that can detect and locate faults in the communication line.

BACKGROUND

Process control systems, like those used in chemical and petroleum processes, typically include one or more process controllers communicatively coupled to at least one host or operator workstation and to one or more field devices via analog, digital, or combined analog/digital buses. The field devices, which may be, for example, valves, valve positioners, switches, and transmitters (e.g., temperature, pressure, and flow rate sensors), perform functions within the process plant, such as opening or closing valves and measuring process parameters. The process controllers receive signals indicative of process measurements made by the field devices and/or other information pertaining to the field devices, use this information to implement control routines, and subsequently generate control signals that are sent over the buses or other communication lines to control the operation of the field devices. With the information collected from the field devices and process controllers, an operator or a technician can execute one or more applications at an operator workstation that perform any desired function with respect to the process, such as, for example, configuring the process, viewing the current state of the process, and/or modifying the operation of the process.

In many cases, field devices may require on-site setup, configuration, testing, and maintenance. For example, before a field device can be installed at a particular location at a process control plant, the field device may need to be programmed and may then need to be tested before and after the field device is installed. Field devices that are already installed may also need to be regularly checked for maintenance reasons or, for example, when a fault is detected and the field device needs to be diagnosed for service or repair. Generally speaking, configuration and testing of field devices are performed on location using a handheld, portable maintenance tool. Because many field devices are installed in remote, hard-to-reach locations, it is more convenient for a user to test the installed devices in such remote locations using a handheld, portable tool rather than using a full configuration and testing device, which can be heavy, bulky, and non-portable, generally requiring the installed field device to be transported to the site of the diagnostic device.

In the case in which a field device is at least partially operational and supplied with power via a local bus, a handheld maintenance tool or portable testing device ("PTD") can connect to a communication terminal of the field device to run a diagnostic routine. Generally, the field device and the PTD communicate over a two-wire or a four-wire communication connection or line, typically referred to as a bus. For example, FOUNDATION® Fieldbus devices and HART® devices are typically connected to a two-wire (or in some cases a four-wire) connection line or bus when installed in a plant environment. It is known to use a handheld device to connect to, for example, a Foundation Fieldbus or a HART communication line or other communication bus to communicate with devices connected to that communication line or bus.

In some cases, Intrinsic Safety ("IS") standards restrict the manner in which power and other communication signals can be provided to a field device, especially when the field device is installed in a critical or dangerous process control system in the field. Generally, higher voltages are used for providing power to the field devices than the voltages that are used for communicating with the field devices. Additionally, certain safety measures must be implemented before powering a field device in the field. In particular, according to IS guidelines, a technician cannot switch on the power of a field device within the field device itself and cannot use devices that generate voltages over certain predetermined levels. The IS guidelines prohibit internal power switching and generation of larger voltages because field devices are often installed in proximity to volatile substances or volatile processes, and thus there is higher possibility of causing an explosion by arcing or generating sparks when a high voltage or a power connection is applied to the field device. For reference, an internal switch may be considered any switch that is integrally connected within or physically housed within a field device and/or that is fixed to the field device.

Related IS guidelines also advise against switching on power within a PTD that is connected to a field device and that is located within a vicinity of the field device. IS standards generally require manual intervention when applying power to a non-operating or a non-powered field device installed in the field. Although it may be desirable to configure existing PTDs with automatic power functions for powering a field device, this configuration is generally prohibited under the IS standards, especially when providing higher power signals to the field devices for powering the field devices or for testing purposes.

To comply with IS standards, some existing PTDs include an interface with four connection ports for coupling four lines or wires between the PTD and a field device undergoing testing. Generally, a first pair of lines is used for transmitting communication signals at a first voltage range and a second pair of lines is used for powering the field device at a second and higher voltage or voltage range. The first pair of lines is primarily used whenever the field device is undergoing testing, and the second pair of lines/wires is used only when power is needed to be provided to the field device to enable the field device to execute a function (e.g., a test function or a configuration function). In this manner, additional power to the field device undergoing testing always requires manual intervention that includes connecting additional wires between the field device and the PTD. In short, IS standards have generally limited the development of portable field device testing equipment to require two separate sets of lines or lead sets and three or four ports for connecting a field device to the portable testing equipment.

In any event, it is difficult, if not impossible, to use handheld devices to communicate with field devices via an installed communication line or bus if the communication line or bus has a fault, such as a short circuit (a low impedance) fault or an open circuit (a high impedance) fault. Moreover, when such a fault exists in a communication bus, it can be difficult to detect the existence of the fault in the bus or the communication line in the first case. For example, a handheld device may be able to connect to and operate on the bus, and may even be able to communicate with some of the devices on the bus, when the bus experiences a high impedance fault. In these cases, it is difficult for the operator to know whether the inability to communicate with a field device on the bus is being caused by a fault in the bus or by a fault within the device on the bus. Still further, even if the operator knows that there is a fault in the communication line or bus, it is difficult for the operator to know where the fault exists and thus be able to easily find and repair the fault. In some cases, the communication and power lines of process control communication busses can traverse great distances within a plant, and these lines may be hidden, covered or otherwise hard to see, as installed in the plant. Thus, it may take a long time to visually inspect a line to find a fault, even if the operator knows a fault exists within the line.

SUMMARY

A handheld maintenance tool operates to detect the existence of a fault in a communication line or bus of a process control network, and additionally may operate to detect a location or approximate location of the fault within the line or bus. The handheld maintenance tool may detect various types of line or communication bus network faults, such as short circuit or other low impedance faults, open circuit or other high impedance faults, etc. Additionally, the handheld maintenance tool may operate in a secondary mode to detect an approximate location of a fault with respect to the handheld device, to thereby enable an operator or maintenance person to more easily find and repair a detected fault.

In some cases, the handheld maintenance tool may be used to supply power and control and communication signals on a control loop, having a one or more field devices connected to a set of communication lines, using one or more known process control communication protocols, such as the HART and the Foundation Fieldbus protocols. Additionally, as part of this process, the handheld maintenance tool may implement diagnostics hardware and software that can be used to verify whether the handheld device is successfully supplying power or communication signals to one or more field devices within the control loop. In one example, the handheld device may provide power (e.g., in the form of a voltage signal) on the loop, and after the power supply is stabilized for a few seconds, the diagnostics hardware and software may measure voltage across and current on the loop. If the voltage measured is the same voltage as supplied, but there is no or only limited current measured, meaning that the power is not being consumed, the device may detect an open circuit fault in the control loop or bus. This technique can be aided by providing a dummy load to the loop, for example, near the connection to the handheld device.

In another case, the handheld tool may supply power to control loop with specific low current and high current inputs. The high current threshold may be, for example, 40 mA. In some cases, in which the number of devices on the loop is known not to exceed a specific limit, the handheld device may detect if the current drawn exceeds a high limit. If so, a short circuit or other low impedance fault may be detected. In other cases, in which the number of active field devices on the loop is not known, the handheld device may limit current draw to a particular limit, and if the current draw reaches or exceeds this limit, the handheld device may increase the limit in one or more steps to a new high limit. If the current reaches the new high limit, then a short circuit or other low impedance fault condition may be detected. Thus, in this case, the high current limit may be based on the number of loads or active devices that are connected to the loop. In any case, if the current reaches or goes above a predetermined or preset high limit threshold, the handheld device may shut off the power supply and detect a short circuit condition on the bus or loop.

In still another case, the handheld maintenance tool may detect the location of a fault, such as an open circuit fault, using an electromagnetic pulse signal. For example, the handheld device may generate an electromagnetic pulse or a series of electromagnetic pulses and send these pulses over the communication lines. The handheld maintenance tool may, for example, include a circuit that uses one or more operational amplifiers to generate a pulsed current output at, for example, up to 250 mA. Of course, because the handheld device is typically battery operated, the number of such pulses that can be generated during any particular battery recharging cycle may be limited, and the handheld device may notify the user via a user interface of the status of use usage of the pulse signal generator, such as an indication of the number of such tests available based on the current battery charge. In any event, the handheld device may generate a pulse and then detect a reflection or an echo of the pulse on the communication lines to determine the location of the open circuit or other high impedance fault. In particular, the handheld device may detect the time at which a return or echo pulse is received as compared to the time that the initial pulse is placed on the communication lines, and the handheld device may determine the approximate distance to the fault based on that timing difference. In another case, the handheld maintenance device may detect the signal power or amplitude of the return or echo pulse and determine the distance to the fault based on the degradation in the amplitude of the echo pulse as compared to the amplitude of the original pulse placed on the communication lines. In some cases, this method of determining a distance to the fault from the handheld device may operate better if (or may even require that) any unused nodes or device connections on the communication line be capped with a predetermined type of terminator having a specific input impedance, so as to eliminate or at least limit the electromagnetic reflections at these points in response to the generation of the testing pulses. This additional feature thereby enables any reflections from terminated nodes to be detected as such.

Moreover because, in some cases, electromagnetic pulses may not be suitable for intrinsic safe (IS) applications (as this method may involve generating a significant amount of power or voltage), the handheld maintenance device may operate to limit the electromagnetic pulses to a particular power or voltage level, so that this hardware can be incorporated into an intrinsically safe application with proper power modulation, such that this method will not induce any sparks. In other cases, in which generation of an electromagnetic pulse is not allowed in an intrinsically safe environment, the circuitry that generates the electromagnetic pulse may be housed in a removable or separate housing that can be easily connected to the handheld device. This configuration enables the fault detection circuitry to be attached to the handheld device and to be used to detect fault locations in a non-intrinsically safe environment, and to be removed from the handheld device to enable the other functionality of the handheld device to be used in an intrinsically safe manner in an intrinsically safe environment.

In one embodiment, a method of detecting a fault in a process control communication network having a communication line and one or more devices connected to the communication line includes providing a first electronic signal on the communication line from a handheld device, measuring at the handheld device a second electronic signal on the communication line in response to the first electronic signal on the communication line; and analyzing at a computer processor within the handheld device the measured second electronic signal to determine a high impedance fault in the communication line. The method may also include indicating the existence of a detected high impedance fault to a user via a user display on the handheld device. If desired, measuring the second electronic signal on the communication line may include measuring a current on the communication line, and analyzing the measured second electronic signal may include determining if the measured current on the communication line is below a threshold, such as zero or near zero, or a threshold that is less than a current draw expected for a particular number of devices on the communication line. In the latter case, the method may include storing an indication of a number of devices known to be attached to the communication line in a memory of the handheld device and using the stored indication of the number of devices known to be attached to the communication line as the particular number of devices. Still further, the method of detecting a fault in the process control communication network may include connecting a known load across the communication line, and analyzing the measured second electronic signal may include determining if the measured current on the communication line is equal to the current drawn through the known load. Likewise, the method of detecting a fault in the process control communication may further include storing an indication of an expected current draw for a number of devices known to be attached to the communication line in a memory of the handheld device and using the stored indication of the expected current draw for a number of devices known to be attached to the communication line to determine the threshold.

Moreover, the method of detecting a fault in the process control communication network may further include detecting a location of the fault on the communication line by generating a pulse signal on the communication line at the handheld device at a first time, detecting an echo pulse signal on the communication line at the handheld device at a second time, the echo pulse signal being a reflection of the pulse signal at the fault, and using the echo pulse signal to determine the location of the fault on the communication line. In one case, using the echo pulse signal to determine the location of the fault on the communication line may include determining a time differential between the first time and the second time and using the time differential to determine a distance to the fault. In other case, the using the echo pulse signal to determine the location of the fault on the communication line may include determining an amplitude of the echo pulse signal and using the determined amplitude of the echo pulse signal to determine a distance to the fault. More particularly, the using the determined amplitude of the echo pulse signal to determine a distance to the fault may include comparing the amplitude of the echo pulse signal to the amplitude of the pulse signal to determine a degradation in amplitude and using the degradation in amplitude to determine a distance to the fault. Additionally, using the determined amplitude of the echo pulse signal to determine a distance to the fault may include storing one or more signal propagation factors in a memory of the handheld device and using the one or more stored signal propagation factors in addition to the degradation in amplitude to determine a distance to the fault.

Moreover, the method of detecting a fault in the process control communication network may include generating a first pulse signal on the communication line having a first amplitude, detecting whether or not an echo pulse signal is received in response to the first pulse signal in a particular period of time, and if no echo pulse signal is received in the particular period of time, generating a second pulse signal on the communication line having a second amplitude greater than the first amplitude, and detecting whether or not an echo pulse signal is received in response to the second pulse signal in a second period of time. Still further, the method of detecting a fault in the process control communication network may further include tracking battery usage of the handheld device caused by generating the pulse signal, and alerting a user of the handheld device about a power status relating to use of the pulse signal for detecting a fault location.

In another case, a handheld maintenance tool for use in detecting a fault in a communication line of process control system includes an input/output interface configured to electronically connect to the communication line, a power source for placing power and communication signals on the communication line, one or more electronic signal sensors, a user interface, such as an electronic display and/or sound generating interface, a processor; and a computer readable memory that stores a program to be implemented on the processor. The program, when executed on the processor, measures an electronic signal on the communication line in response to a power signal being placed on the communication line, analyzes the measured electronic signal to determine a high impedance fault in the communication line, and indicates the existence of a detected high impedance fault to a user via the user interface.

The one or more electronic signal sensors may include voltage sensors and may include a current sensor that measures a current on the communication line. The program may analyze the measured electronic signal by determining if the measured current on the communication line is below a threshold, such as near zero or a threshold that is less than a current draw expected for a particular number of devices connected to the communication line. In this case, the computer readable memory may store an indication of a number of devices known to be attached to the communication line and the program may use the stored indication of the number of devices known to be attached to the communication line as the particular number of devices and in particular. Likewise, the computer readable memory may store an indication of an expected current draw for a number of devices known to be attached to the communication line and the program may use the stored indication of the expected current draw for a number of devices known to be attached to the communication line to determine the threshold. The program may also determine if the measured current on the communication line is equal to the current drawn through a known dummy load connected across wires of the communication line.

The handheld maintenance tool may further include a pulse signal generator adapted to generate a pulse signal on the communication line, and the program may further cause the pulse signal generator to place a pulse signal on the communication line at a first time, use the one or more electronic signal sensors to detect an echo pulse signal on the communication line at the handheld device at a second time, the echo pulse signal being a reflection of the pulse signal at the fault, and may use the echo pulse signal to determine the location of the fault on the communication line. In particular, the program may use the echo pulse signal to determine the location of the fault on the communication line by determining a time differential between the first time and the second time and using the time differential to determine a distance to the fault. In addition or alternatively, the program may determine an amplitude of the echo pulse signal and use the determined amplitude of the echo pulse signal to determine a distance to the fault. For example, the program may compare the amplitude of the echo pulse signal to the amplitude of the pulse signal to determine a degradation in amplitude and may use the degradation in amplitude to determine a distance to the fault. Additionally, the program may track battery usage of the handheld maintenance tool caused by generating the pulse signal and may alert a user of the handheld maintenance tool via that user interface regarding a power status relating to use of the pulse signal.

According to another embodiment, a method of detecting the location of a fault in a process control network communication bus having a set of communication lines and one or more devices connected to the set of communication lines includes generating a pulse signal on the communication lines via a handheld device connected to the communication lines at a first time, detecting an echo pulse signal on the communication lines at the handheld device at a second time, the echo pulse signal being a reflection of the pulse signal at the fault, and determining, via a computer processor in the handheld device, the location of the fault on the communication lines based on the detected echo pulse signal.

According to a still further embodiment, a handheld maintenance tool for use detecting faults in a set of communication lines of a process control system includes an input/output interface configured to connect to the communication lines, a pulse signal generator configured to generate a pulse signal to be placed on the communication lines, one or more electronic signal sensors, a user interface, a processor, and a computer readable memory that stores a program to be implemented on the processor. The program operates to measure an electronic signal on the communication lines in response to the pulse signal on the communication lines, to analyze the measured electronic signal to determine a location of a fault in the communication lines, and to indicate the existence of the determined location of the fault to a user via the user interface. If desired, the one or more electronic signal sensors includes a current sensor or a voltage sensor that detects an echo pulse signal on the communication lines. The program may further cause the pulse signal generator to place a pulse signal on the communication lines at a first time, may use the one or more electronic signal sensors to detect an echo pulse signal on the communication lines at the handheld device at a second time, the echo pulse signal being a reflection of the pulse signal at the fault, and may use the echo pulse signal to determine the location of the fault on the communication line. In particular, the program may use the echo pulse signal to determine the location of the fault on the communication line by determining a time differential between the first time and the second time and using the time differential to determine a distance to the fault. Additionally or alternatively, the program may determine an amplitude of the echo pulse signal and uses the determined amplitude of the pulse signal to determine a distance to the fault. For example, the program may compare the amplitude of the detected echo pulse signal to the amplitude of the pulse signal to determine a degradation in amplitude and may use the degradation in amplitude to determine a distance to the fault. Likewise, the program may track battery usage of the handheld device caused by generating the pulse signal and may alert a user of the handheld device via that user interface regarding a power status relating to use of the pulse signal. Still further, the handheld device may include a first housing and a second housing that is removably connected to the first housing, wherein the processor, the one or more electronic signal sensors, and the user interface are disposed in the first housing, and wherein the pulse signal generator is disposed in the second housing.

In another embodiment, a method of detecting a fault in a process control network having a communication line and one or more devices connected to the communication line, comprising providing a first power signal (such as a voltage or a current limited power signal) on the communication line at a first amplitude level from a handheld device connected to the communication line, measuring a current on the communication line in response to the first power signal on the communication line at the handheld device, and analyzing the measured current signal via a processor within the handheld device to determine the existence of a low impedance fault in the communication line in response to the first power signal. If a low impedance fault condition is not determined in response to the first power signal on the communication line, the method provides a second power signal (such as a voltage signal or a current limited power signal) on the communication line at a second amplitude level higher than the first amplitude level, measures a further current signal on the communication line in response to the second power signal on the communication line, and analyzes the measured further current signal to determine the existence of a low impedance fault in the communication line. If a low impedance fault is determined for either of the first power signal or the second power signal, the method indicates the existence of a detected fault to a user via a user interface on the handheld device. The method of detecting a fault in a process control network may further include removing the first power signal or the second power signal from the communication line if a low impedance fault is determined for either of the first power signal or the second power signal. Moreover, the method of detecting a fault in a process control network may analyze the measured current signal to determine the existence of a low impedance fault in the communication line in response to the first power signal by determining if the measured current signal is higher than a threshold. Likewise, the method of detecting a fault in a process control network may analyze the measured current signal to determine the existence of a low impedance fault in the communication line in response to the first power signal by determining if the measured current signal is higher than a first threshold and may analyze the measured further current signal to determine the existence of a low impedance fault in the communication line in response to the second power signal by determining if the measured further current signal is higher than a second threshold, wherein the second threshold is greater than the first threshold.

Still further, the method of detecting a fault in a process control network may further include storing an indication of an expected current draw from one or more devices on the communication line in a memory of the handheld device and may analyze the measured current signal to determine the existence of a low impedance fault in the communication line in response to the first power signal by determining if the measured current signal is higher than a first threshold derived from the indication of an expected current draw from one or more devices on the communication line.

DETAILED DESCRIPTION

The devices and methods, as described herein, generally enable detection of faults within a communication network such as a process control communication network, including, for example, short circuit (low impedance) faults and open circuit (high impedance) faults. More particularly, in one example, a handheld device and method using a portable or handheld device connects to field devices within a network, such as a hardwired communication network, and provides power and/or communication signals over a, for example, two-wire lead set or a two-wire communication line, while also in some cases complying with Intrinsic Safety ("IS") standards, so as to perform protocol communications with one or more devices on the network as well as diagnostics or other operations with respect to the devices on the communications network. The handheld device and methods using that device provide many safety features and advantages over the systems that currently communicate with and supply power to field devices, and therefore a brief description of these known systems will be provided.

Portable configuration and calibration tools often require a two-wire connection between a handheld maintenance tool or a portable testing device ("PTD") and a field device, with the two-wire connection being used to provide communication between these two devices. For example, a FOUNDATION® Fieldbus device generally requires a two-wire communication line or a two-wire lead set to be connected between a PTD and the fieldbus device to set up, configure, or diagnose the field device. When the field device is already powered, the two-wire communication line is generally sufficient to complete the configuration and testing of the field device. On the other hand, it is sometimes more convenient or necessary to use a PTD that provides the necessary power during configuration or testing when the field device, such as a FOUNDATION® Fieldbus device, requires power for testing and/or configuration. IS standards, however, do not allow power to be switched on from within the PTD or from within the field device itself (e.g., when auxiliary or redundant power lines are available) because such PTDs are often used in hazardous and explosive environments.

Figure 1:
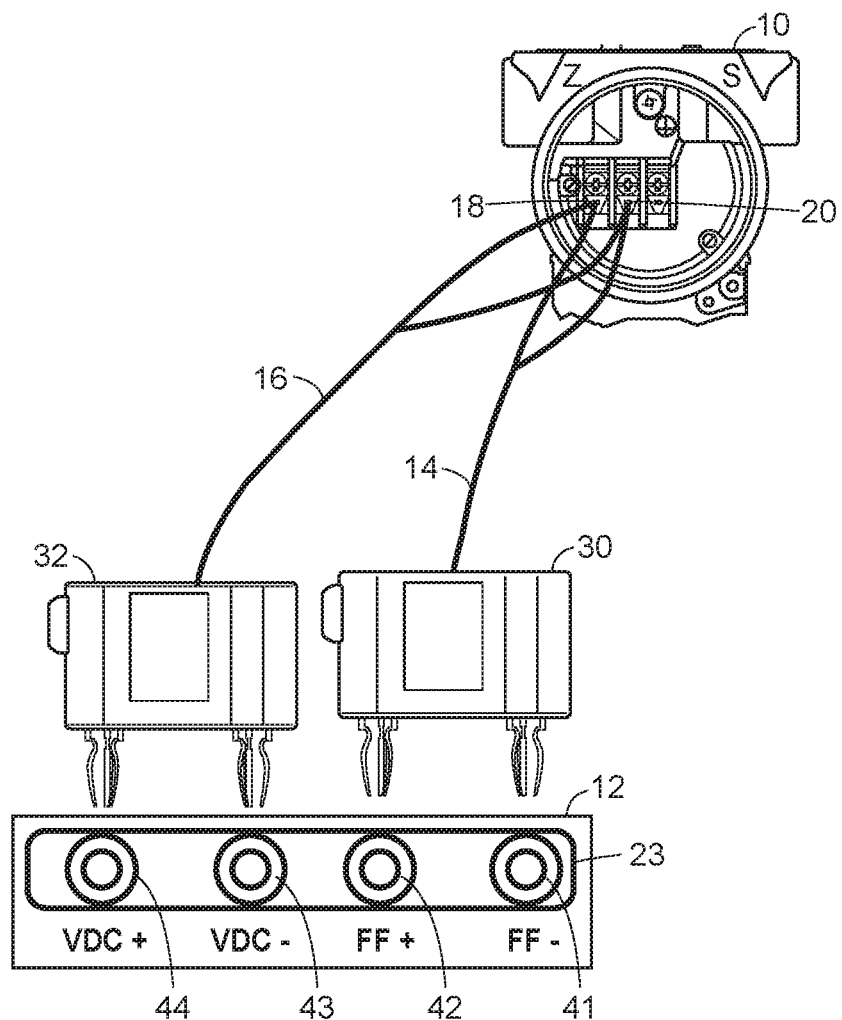
FIG. 1 illustrates a prior art system for supplying power and communication signals to a field device undergoing testing.

FIG. 1 illustrates an existing system including a field device 10 and a PTD 12 that simultaneously communicates with the field device 10 and supplies power to the field device 10 under configuration, operational, and testing conditions. Generally, a first pair of wires 14 from the PTD 12 is connected to a pair of input and output terminals 18, 20 of the field device 10 to communicate with the field device 10. For example, the PTD 12 may perform a diagnostic routine that extracts information from the field device 10 and/or the PTD 12 may configure the field device 10 by sending program instructions to the field device 10 across the first pair of wires 14. In the existing system of FIG. 1, a technician can determine that the field device 10 is not powered when the PTD 12 fails to obtain a reading from the field device 10. In some cases, the technician can confirm the power state of the field device 10 from a visual inspection or from an indicator on the field device 10 itself. If the field device is in a non-powered state, the technician may then connect a second pair of wires 16 between the PTD 12 and the field device 10 undergoing testing to supply power to the field device 10. Generally, the PTD 12 has an input/output interface 23 that provides sockets, jacks, or any other type of electrical receptacles for connecting two, two-prong plugs 30, 32 to the PTD 12. As used herein, a prong may refer to any kind of male connector that couples with an electrical receptacle or female connector, such as the jacks of the PTD input/output or communication interface 23 of FIG. 1. Each of the two-prong plugs 30, 32 connects with one of the two-wire pairs 14, 16, respectively, wherein each wire of the pairs of wires 14, 16 is connected to a separate prong of each plug 30, 32.

The input/output communication interface 23 of the PTD 12 includes four jacks 41, 42, 43, 44. A first pair of jacks 41, 42 may be used for electrically coupling to the first two-prong plug 30 to provide communication signals to the field device 10. As used herein, electrically coupling two or more elements may refer to a connection that allows electricity to be conducted between the two or more elements. A second pair of jacks 43, 44 may be used for electrically coupling the second two-prong plug 32 to provide power to the field device 10 via the second pair of wires 16. General safety rules, such as IS standards, dictate that all electrical lines that carry power must be connected to the field device 10 before applying power to the electrical lines. This rule may extend to low voltage communication signals such as the communication signals transmitted along the first wire pair 14 as well as to the higher power voltages on the second wire pair 16. Any system that does not implement this directive may be contrary to the IS standards. Moreover, according to the IS standards, any power switching means must be located externally to the field device 10. The configuration of FIG. 1 complies with existing IS standards because the power cannot be switched on within the field device 10 itself. Additionally, the configuration of FIG. 1 allows for a user to manually connect the terminals 18, 20 of the connector assembly to the field device 10 before connecting the plugs 30, 32 to the corresponding jacks 41, 42, 43, 44 of the PTD interface 23. While the system of FIG. 1 illustrates the PTD 12 being connected directly to terminals of the field device 10, the PTD 12 could instead be connected to terminals of a communication line or bus (such as a Foundation Fieldbus bus or a HART communication line) and communicate with one or more devices on the bus, or network lines.

Figure 2:
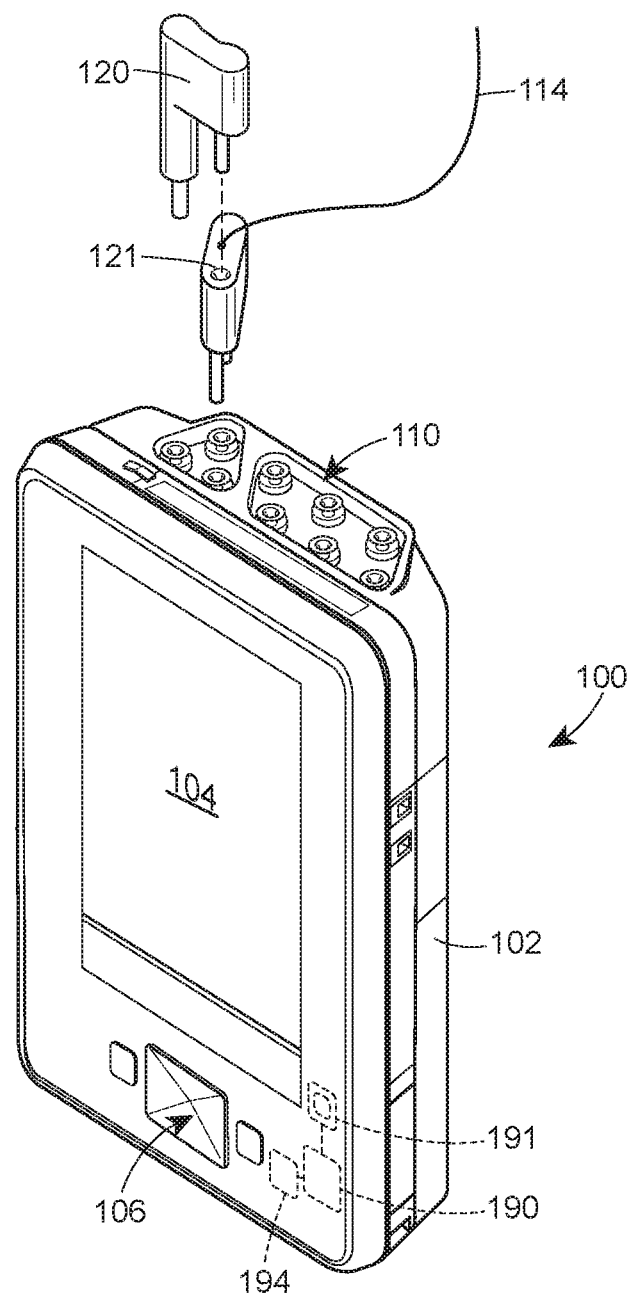
FIG. 2 illustrates an example handheld communication device having fault detection capabilities when connected to a plant communication network.

FIG. 2 illustrates an example handheld communication device or maintenance tool 100 having fault detection and fault location detection capabilities. The handheld communication device 100 may be connected to a plant communication network that uses, for example, a two-wire or a four-wire communication line or bus, and the device 100 may provide communication signals between devices on the bus, such as controllers, field devices, input/output devices, or other types of devices on the bus or network. Additionally, the device 100 may provide auxiliary power to one or more of the field devices on the bus or network when needed.

The example handheld device 100 of FIG. 2 includes a body or housing 102 with a user interface display 104 and various user interface buttons 106, which may be used to scroll through screens displayed on the display 104, and/or to enable a user to take other actions with respect to the information displayed on display 104 and/or to implement functions of the handheld device 100. Still further, the handheld device 100 includes a communication and power signal input/output interface 110, including a series of ports that may be used to connect the handheld device 100 to various different types of field devices or buses, such as FOUNDATION® Fieldbus devices or busses, HART® field devices or busses, CAN field devices or busses, Profibus field devices or busses, etc. In some instances, different port configurations may be provided in the input/output interface 110, the port configurations including various different pins, jacks, or other types of connections that may be used to electronically connect the device 100 to different types of field devices or communication lines or busses associated with different process control network communication protocols, such as any of those mentioned above. Moreover, the input/output interface 110 may enable the device 100 to provide power from the handheld device 100 to a field device over a communication bus or line for testing purposes. The pin or port connections of the interface 110 may include, for example, two-pin connections, three-pin connections, four pin connections, etc. For example purposes only, a three pin connector made up of two interlocking two-pin connectors 120 and 121 is illustrated in FIG. 2 as being removably connected to a three port connector arrangement on the interface 110 of the device 100. Additionally, the handheld device 100 includes various electronics and electronic circuits, including a processor 190, one or more computer readable memories 191, signal generation and detection circuitry 194, and other associated circuitry (which may be hardware, firmware, etc.) connected to the processor 190, the memory 191 and the signal generation and detection circuitry 194. The memories 191 and the processor 190 may store and execute software (or firmware) which performs computing functionality to the control the power and signal generation circuitry 194, to perform configuration, messaging, analytics, and to provide user input/output access and user display functionality via the display 104 of the handheld device 100. While not explicitly shown in FIG. 2, the handheld device 100 may include a user interface having audio based interface components, such as one or more beepers, speakers, audio alarms, etc., which may be used to communicate with the user The circuitry 194 may include various power, voltage, and/or current signal generation circuits, and various sensors, such as voltage sensors, current sensors, etc., which are configured to operate to place power and communication signals onto a communication line connected via the interface 110, to measure or detect power signals and communication signals on a communication line connected via the interface 110, and to perform various tests and analyses on signals received from the bus or network connected to the interface 110 to perform diagnostics on the network, such as detecting the existence of and the location of low impedance or high impedance faults. More specifically, the circuitry 194 may be coupled to and be controlled by the processor 190 (operating under computer instructions stored in the memory 191) and may provide information to the processor 190 in order to enable the functionality of the device 100 to for example drive outputs of the handheld device 100, to perform protocol based communication and power functions on a bus or network (as defined by one or more process control communication protocols such as any of those mentioned above), to perform communication line fault existence and location detection, to perform user interface input/output operations via the user interface display 104, the user interface buttons 106 and user interface audio components (not shown), and to perform other functions of the device 100. Still further, the memories 191 may store programming (e.g., one or more programs) to be executed on the processor 190, as well as data to be used by the programs to perform the various functions described herein. In particular, the programs, when executed on the processor 190 and used to control the power and signal generation circuitry 194, may operate to perform various open circuit, short circuit, or other types of fault detection and fault location detection capabilities within a control loop implemented on a communication bus or line to which one or more field devices are connected. These tests may be performed when providing power to a control loop or otherwise providing communication signals via a communication bus or line in a control loop.

Figure 3:
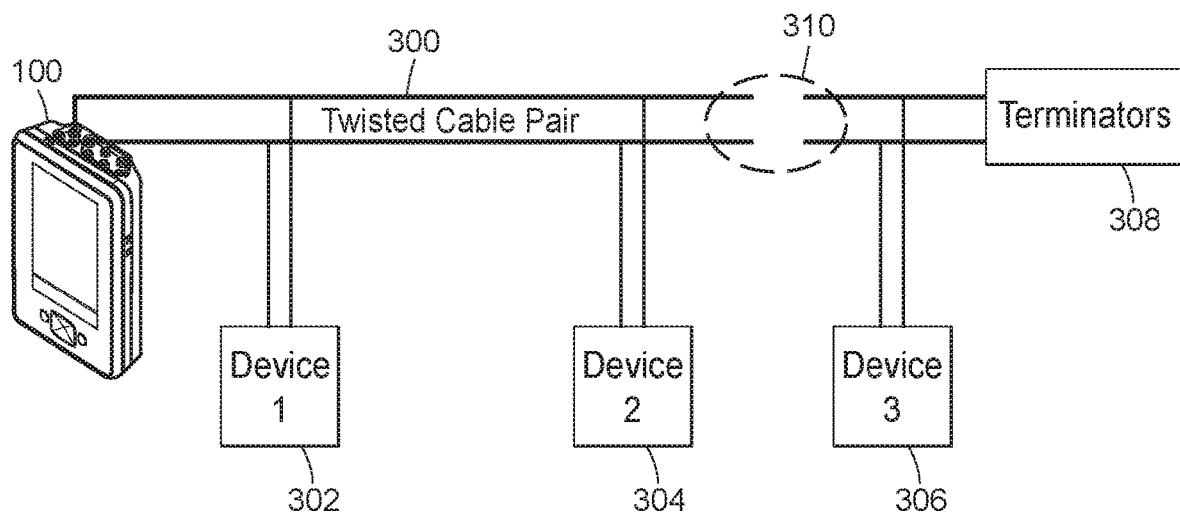
FIG. 3 illustrates a handheld communication and maintenance device connected to a plant communication network having an open circuit fault.

By way of example, FIG. 3 illustrates a handheld device 100 (which may be the device 100 of FIG. 2) connected to a communication network 300 (illustrated as a two wire network) having three field devices 302, 304, 306 connected thereto and having one or more termination devices 308 connected to terminal ends of the network 300. The communication network 300 is illustrated in FIG. 3 as a hard-wired communication network having, in this case, a cable pair (e.g., a twisted cable pair) that provides the backbone of the network 300, and to which the three field devices 302, 304 and 306 are connected. In this case, an open circuit fault, illustrated with a dotted circle 310, is illustrated as existing in the twisted cable pair of the network 300. An open circuit could also exist at a connection to a field device, at one of the terminals of the network to which no terminator is connected, etc. In the case of FIG. 3, however, one or both of the cables or lines of the twisted cable pair 300 are split or are separated and thus create an open circuit between device 304 and the device 306. Moreover, in the example of FIG. 3, the handheld device 100 is illustrated as being connected to the network bus 300, but could instead be connected directly to appropriate terminals of one of the field devices 302, 304, 306. In any event, the device 100 may be used to detect the open circuit condition 310 or other high impedance fault, and may also be used to detect the relative or approximate location of such an open circuit.

Figure 4:
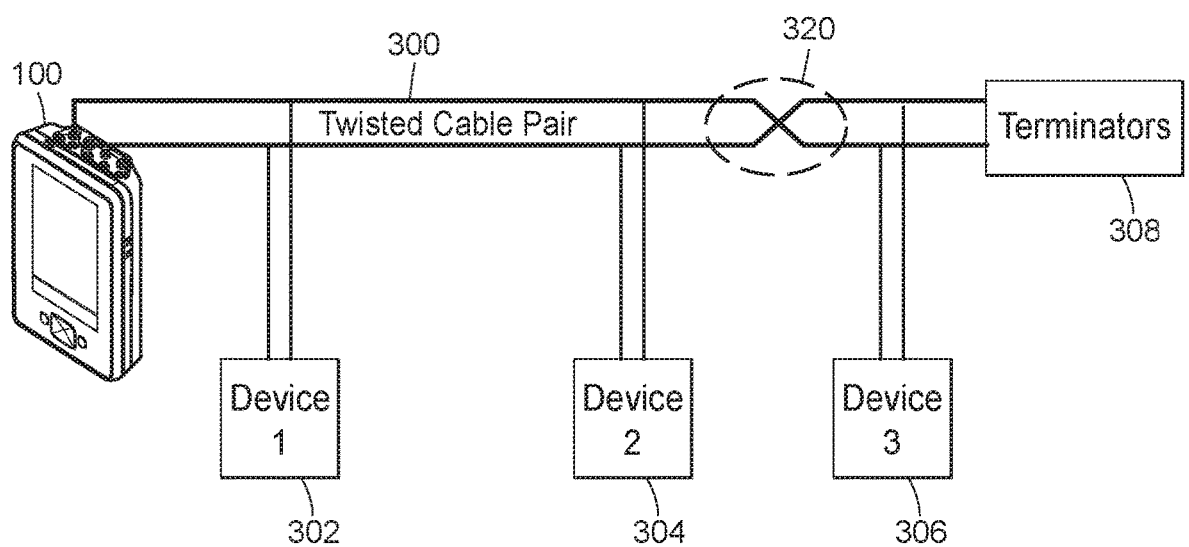
FIG. 4 illustrates a handheld communication and maintenance device connected to a plant communication network having a short circuit fault.

As another example, FIG. 4 illustrates the handheld device 100 connected to the network 300 which, in this case, has a short circuit fault illustrated by a dotted circle 320. In particular, the network 300 of FIG. 4 may be the same network as that illustrated in FIG. 3, except that the network 300 of FIG. 4 includes a short circuit condition 320 instead of an open circuit condition or fault 310. In this case, the handheld device 100 may supply power to the network 300, but in doing, may also operate to detect the existence of the short circuit 320 or other low impedance fault within the network 300.

Figure 5:
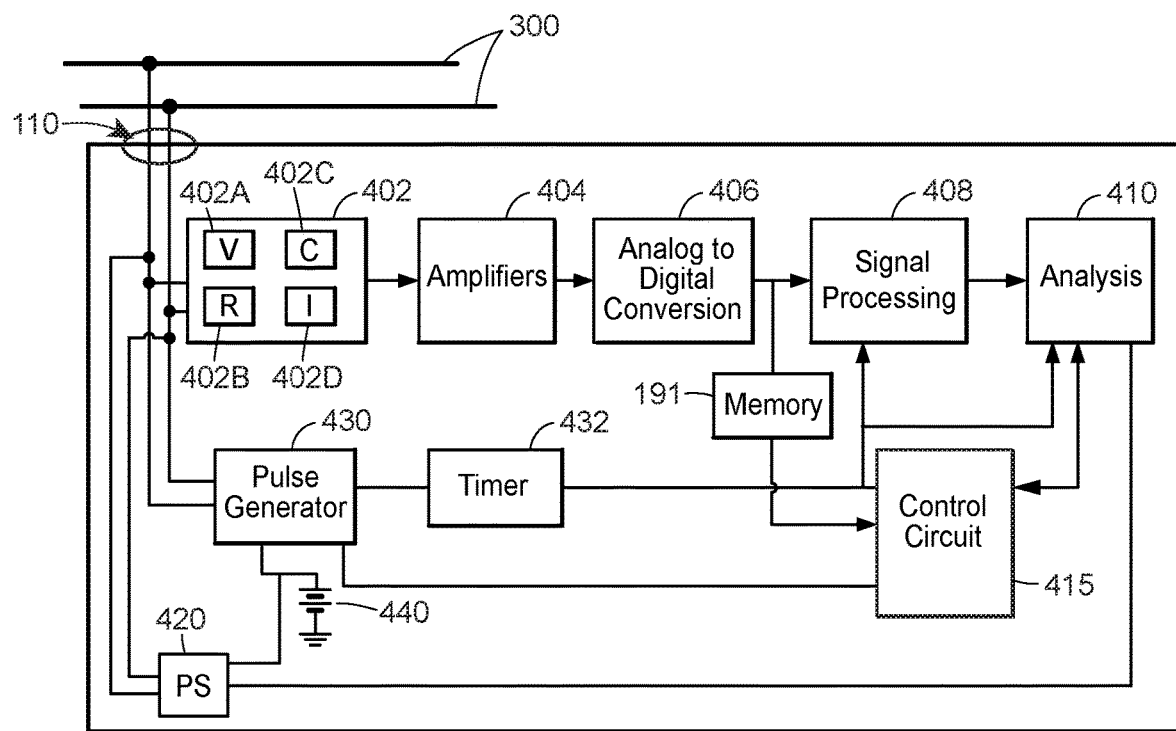
FIG. 5 depicts a block diagram of exemplary fault detection circuitry within the handheld communication and maintenance device of FIG. 2.

FIG. 5 illustrates a block diagram of example circuitry, which may be used as part of the signal generation and detection circuitry 194 as well as the processor 190 provided within the handheld device 100 of FIG. 2, to perform standard protocol communications, bus and device powering functions, and the fault detection, fault location determination, and other operations described herein. As illustrated in FIG. 5, the handheld device 100 is connected to the network 300 via the communication interface 110 and particularly includes two ports that connect directly to the two lines or cables of the network 300. The handheld device 100 further includes a physiological process signal block 402, which includes one or more voltage sensors 402A, current sensors 402B, resistance detection circuits 402C, impedance detection circuits 402D, etc., which may measure voltage, current, power, and/or other electrical signals on or properties of the network 300. The physiological process block 402 may include, for example, any number of voltage detection circuits or sensors 402A, current detection circuits or sensors 402B, impedance detection or resistance detection circuits or sensors 402C, 402D, etc., which may operate in known manners to measure voltage, current, impedance, resistance, or other electrical characteristics of the network 300 or of signals on the network 300. The signals produced by the various sensors 402A-402D within the signal block 402 may be provided to one or more amplifiers 404, which may amplify the received signals and provide the amplified signals to an analog-to-digital conversion circuit 406. The analog-to-digital conversion circuit 406 may include one or more analog-to-digital converters, which convert the analog signals received from the amplifiers 404 into digital signals. The digital signals produced by the analog-to-digital convertors 406 may then be provided a memory 191 and/or to a signal processing block 408 which may be implemented in the processor 190 of FIG. 2.

Still further, the system of FIG. 5 includes an analysis block 410 coupled to the signal processing block 408, a control and interface circuit 415, a power and communication signal generating circuit 420 coupled to the control and interface circuit 415 and to the network lines 300, a pulse generating circuit 430 and a timing circuit 432. In this case, the power and signal generating circuit 420 and the pulse generating circuit 430 may be connected to or include a battery 440, which provides energy for generating power signals and/or communication signals to be placed on the communication network 300. The power and/or communication signals may be voltage signals, current signals, etc., and thus the power supply circuit 420 may include a voltage source, a current source, or some combination of both. Still further, the power and communication signal generating circuit 420 may have outputs connected to the network 300 and provide power signals and/or communication signals on the same set of wires (for example, in a two-wire network) or may provide power and communication signals on different sets of wires of the network 300 (for example, in a four wire network not shown in FIG. 5) Likewise, the power and communication signal generating circuit 420 may be driven by the control and interface circuit 415 to provide various different power and/or communication signals on the bus or network 300 at various times as specified by the control and interface circuit 415, which operates to control the communications and tests performed by the device 100 on the network 300. Likewise, as will be described in more detail, the pulse generating circuit 430 may operate in accordance with the control and interface circuit 415 to generate one or more pulses (e.g., voltage pulses or current pulses) on the network lines 300, and the timer circuit 432 may include a clock or other timer which tracks the precise timing of when signals are placed onto and/or when received from the network 300.

As will be understood, the control circuit 415 (which may be implemented as one or more programs executed on the processor 190 of FIG. 2, for example), may implement configuration, communication, testing, and powering features associated with or defined for one or more process control communication protocols, such as the Foundation Fieldbus protocol, the HART protocol, the CAN protocol, the Profibus protocol, etc. As such, the memory 191 may store data and information and the control circuit 415 may operate using that data to perform communication with one or more devices on a communication lines 300 that conforms to a particular process control communication protocol. Thus, the control circuit 415, under instructions received via the user interface 104, 106 of FIG. 2, for example, may perform any pre-stored configuration and communication procedures on a device connected to the communication network or lines 300, in a manner defined by or in accordance with one or more particular process control protocols. However, the control circuit 415 may also perform various communication line fault detection and fault location routines or procedures as described in more detail herein.

In particular, the signal processing block 408, which may be provided as stand-alone hardware or firmware or which may be executed as software or as programming within the processor 190 of FIG. 2, for example, performs signal processing on the digital signals received from the analog-to-digital convertors 406 to, for example, smooth out the signals, filter the signals, perform level, amplitude, frequency, etc., detections on the signals, as well as to compare the timing of various ones of the received signals based on outputs from the timing circuit 432. The analysis block 410, which may also be executed as stand-alone hardware or firmware or which may be executed as software or programming within the processor 190 of FIG. 2, for example, receives the signals produced by the signal processing block 408 and performs analysis on these signals (under control of the control block 415) to detect the existence of and potentially the location of faults within the network 300. Moreover, the control block 415 may perform control of the other elements of FIG. 5 to implement one or more fault detection procedures with respect to the network 300, and in particular to detect short circuit or other low impedance fault conditions on the network 300, to detect open circuit or other high impedance fault conditions on the network 300, to detect the location of a fault, etc. Still further, the control and interface circuit 415 may interface with the user via a user interface (e.g., the display 104 and interface buttons 106 of FIG. 2), to enable a user to initiate various fault detection procedures and to inform the user of the results of these procedures.

In particular, to detect an open circuit condition on the network 300, the analysis block 410 may compare a measured voltage to one or more predetermined stored voltage levels (stored in the memory 191, for example) to determine if the voltage being provided on the network 300 is at a maximum voltage as provided by a power circuit 420 within the device 100 (or as otherwise provided by an external power supply on the network 300) and may detect current flow on the network 300. If a rated voltage is on the network, e.g., the network voltage is at or near rated voltage, and the current flow is at or near zero, the analysis block 410 may determine that there is an open circuit on the network 300. However, in an open-circuit network condition, depending on the location of the open circuit, some of the devices connected to the network may still receive the supplied voltage and thus may draw current. In particular, devices disposed on the network 300 upstream of the open circuit (such as the situation with the devices 302 and 304 of FIG. 3) may still draw current. In this case, the analysis block 410 may be programmed to know the (i.e., store an indication of the) number of devices that are known to be on or connected to the network 300 and/or the expected current draw for each of the devices on the network 300 (or the expected current draw for all of the devices on the network) and may operate to detect whether or not each or every device on the network appears to be operating on the network according to its expected current draw. In these instances, the analysis block 410 may, in fact, compare the expected current draw with the actual measured current draw to detect whether one or more devices are not drawing current from the network 300, that is, to detect the fact that one or more devices expected to be drawing current on the network 300 are not doing so, and so are not connected to the network 300, as seen by the handheld device 100. This situation may indicate a high impedance fault within the network 300 with respect to one or more of the devices on the network 300.

To perform this analysis, the handheld device 100 (and specifically the control circuit 415) may cause the power supply 420 to provide a known power signal on or across the loop or network 300. After the power supply 420 has stabilized power for a time, such as a few seconds, the diagnostics hardware and software (e.g., the blocks 402, 404, 406, and 408 and the analysis block 410) may detect the measured voltage across the network wires and current on the network wires (for example, as measured by the block 402 and conditioned by the signal processing blocks 406 and 408). If the voltage measured is the same voltage as supplied, but there is no or only limited current measured, meaning that the power is not being consumed, the analysis block 410 may detect an open circuit fault in the control loop or bus of the network 300. This technique can be aided by providing a dummy load across the wires of the control loop, for example, near the connection to the handheld device 100 to determine if current drawn from the power supply 420 is equal to that expected to be drawn through the dummy or known load. If the measured current from the device is equal to or nearly equal to that known to go through the dummy or known load at the supplied voltage, then the analysis block 410 may detect an open circuit or other high impedance fault.

Likewise, the analysis block 410 may detect an short circuit in the network 300, such as the situation depicted in FIG. 4, by determining whether, upon the power supply 420 (under control of the control circuit 415) placing a voltage across the cables or lines of the network 300, there is a high current draw detected on the network 300. Such a high current draw may indicate a short circuit or other low impedance condition within the network 300. In this case, the control circuit 415 may operate so that it uses a feedback system to control the power circuit 420 to iteratively provide particular levels of voltage and/or current on the lines of the network 300 so as to protect against damage being caused to the network 300 by high current caused by the existence of a power supply connected to short circuit. In particular, the control circuit 415 may cause the power supply 420 to first provide a small voltage across the network cables to detect first if there is a potential of a low impedance or short circuit condition on the network 300, but doing so in a manner that limits the damage to the network 300 in the form of an extremely high current draw. For example, the control circuit 415 may cause the power supply 420 to supply power via a current limiter or via a current supply to supply a known or limited amount of current onto the communication lines 300. The control circuit 415 may detect (from the analysis block 410 or the signal processing block 408) the measured current draw on the network in response to the provided power signal, and may then step up the voltage (or the maximum allowed current) provided by the power supply 420 in steps, depending upon the expected number of devices on the network 300. Thus, when the power supply 420 first provides voltage to the network 300, the power supply 420 may be controlled may provide a very low voltage and/or a low and current limited current signal onto the network 300. Here, the analysis block 410 may immediately detect, based on the incoming detected current signals, whether there is high current draw across the lines of network 300 (i.e., if the current draw in the network 300 hits the current limit imparted by the power supply 420), to detect whether a low impedance or short circuit condition possibly exists. In one case, if a high current draw is not detected at the current (low) voltage amplitude level, the analysis block 410 may step up the voltage in various iterative steps to determine whether or not a low impedance or short circuit condition exists at higher voltages, leading to excessive current over the current expected to be drawn by the various devices on the network 300. That is, analysis block 410 may compare the measured current as actually provided across the network line (or as drawn by the devices on the network 300) with the expected current draw based on the number of devices actually connected to the network 300. If current draw is higher, for example, at some threshold amount higher than the expected current draw, the analysis block 410 may detect the presence of short circuit or other low impedance condition on the network 300 and the control and interface block 415 may indicate as much to the user via the display 104 (FIG. 2) Additionally, the control circuit 415 may cut off the power supply 420 to remove power from the network 300. In another case, the control circuit 415 may cause the power supply 420 to provide a current limited voltage across the network lines 300 and raise the current amplitude limit imparted by the power supply 420 iteratively in steps over time. The control circuit 415 may measure the current draw in the network and compare this draw with the current limit imparted by the power supply 420. When the current drawn does not reach the limit, then a short circuit condition is detected as not being present. However, if the current drawn reaches the current limit imparted by the power supply 420, then the control circuit 415 may increase the current limit to see if the newly drawn current reaches or equals the current limit. This process may be repeated until the current limit is set to some maximum threshold, at which time the control circuit 415 or analysis block 410 detects the existence of a short circuit in the communication line 300.

Thus, in this case, the handheld tool 100 may supply power to the control loop with specific low current and high current inputs. The high current threshold may be, for example, 40 mA. In some cases, in which the number of devices on the loop is known not to exceed a specific limit, the tool 100 may detect if the current actually drawn on the network exceeds a high limit. If so, a short circuit or other low impedance fault may be detected. In other cases, in which the number of active devices on the loop is not known, the device 100 may limit current draw to a particular limit, and if the current draw reaches or exceeds this limit, the handheld device may increase the limit in one or more steps to a new high limit. If the current reaches the new high limit, then a short circuit or other low impedance fault condition may be detected. Thus, in this case, the high current limit may be based on the number of loads or active devices that are connected to the loop. In any case, if the current reaches or goes above a predetermined or preset high limit threshold, the control circuit 415 may detect a short circuit condition on the bus or loop, shut off the power supply 420 and alert the user via the display 104. The use of this stepped, current-limited approach protects the communication network 300 and, in some cases, the process plant in which the network 300 is installed, from severe damage that could be caused by generating high currents in a short circuit condition.

Still further, as illustrated in FIG. 5, the device 100 may use the pulse generator 430 and the timer 432 as well as the other measurement and processing block 402-410 to detect the location of an open circuit and/or a short circuit within the network 300 upon detecting the existence of such a fault. In many cases, the detected location will be relative to the position of the handheld unit 100, i.e., a distance measured from the location at which the handheld unit 100 is attached to the network 300 to the fault and, in particular, a distance along the wire of the communication network from the location at which the handheld unit 100 is attached to the network 300 and the fault. In particular, during operation, the pulse generator 430 may generate one or a series of electronic pulses (e.g., voltage pulses) and may place these pulses on the network 300 at known or measured times. At or immediately after placing a pulse on the network 300, the timer 432 may start a counter to determine the time elapsed since the pulse is placed on the line of the network 300. After the pulse is placed on the line, the analysis block 410 may begin to receive or detect current or voltage signals on the lines of the network 300, (e.g., voltage or current signals measured by the process block 402, and converted to digital signals indicative of current or voltage measurements as performed by the blocks 404, 406, and 408). At some time after a pulse is placed on the network lines, the analysis block 410 may detect the receipt of a pulse on the network lines that is a reflection of the original pulse from a high impedance or open circuit fault. This reflected pulse is sometimes referred to herein as an echo pulse. The analysis block 410 may also receive the output of the timer 435 and determine the timing difference between the placing of the original pulse on the network 300 at a first time and the receipt of the reflection or echo pulse at a second and later time. Such an echo pulse occurs because of the open circuit condition and, more particularly, because of the lack of terminators 308 at the open circuit location. In particular, the open circuit condition is a fault that has no terminators thereon which cause the termination to match the impedance of the line, meaning that the electronic pulse signal will generally create a significant reflection component when the pulse signal encounters the open circuit fault. In other words, due to the impedance mismatch at the open circuit location, a reflection of the original pulse will be generated and will be transmitted back along the wires of the network 300 to the handheld device 100.

Figure 6A:
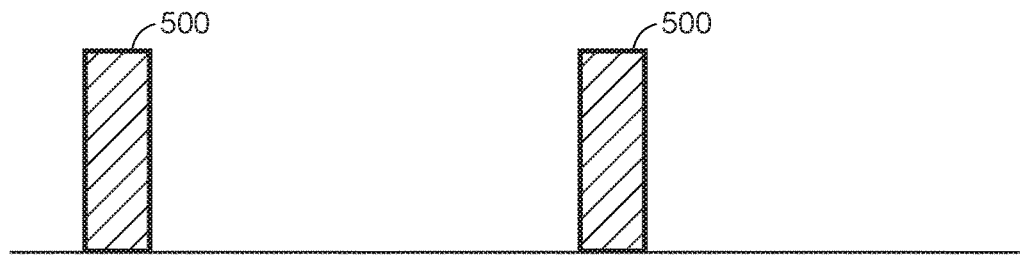
FIGS. 6A and 6B depict pulse generation and reflection diagrams illustrating the reflection of a pulse signal on a plant communication line, which reflection can be used to detect a fault location on the communication line.
Figure 6B:
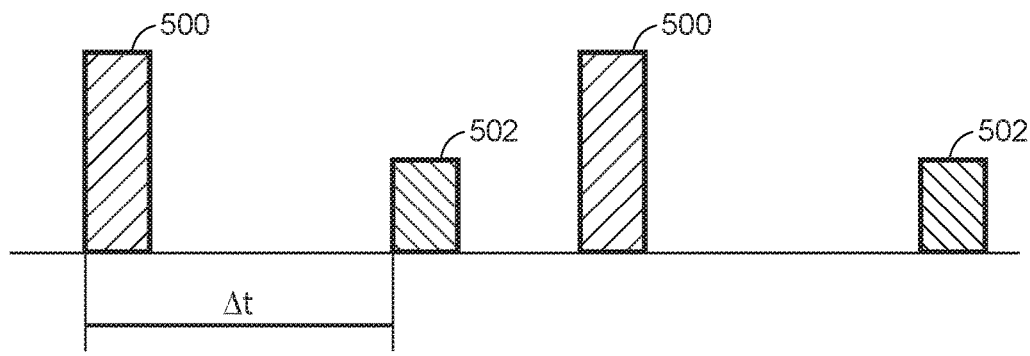

To illustrate this point, FIG. 6A depicts a timing diagram in which a series of pulses 500 are generated and placed onto the network 300 by a pulse signal generator 430 at periodic times or potentially non-periodic times if so desired. The timing diagram of FIG. 6B illustrates the echo pulses 502 that might be received from the pulses 500 of FIG. 6A based on the open circuit condition existing in the network 300 (i.e., an open or high impedance fault with a lack of a proper termination that matches the impedance of the connection). FIG. 6B also illustrates a time differential $\Delta t$ between the sending of the pulse 500 and the receipt of the echo pulse 502. Moreover, FIG. 6B illustrates an amplitude difference between the pulse 500 and the received echo pulse 502. The echo pulses 502 illustrated in the diagram of FIG. 6B are detected back at the block 402 at a particular time or offset time $\Delta t$ between from the time at which the pulse 500 that generates the echo pulse 502 was sent.

This offset time, i.e., the time between the placing of the pulse 500 on the line (e.g., the leading edge of the pulse, the trailing edge of the pulse, the center of the pulse, etc.) and the time at which the echo pulse 502 is received on the line (e.g., the leading edge of the pulse, the trailing edge of the pulse, the center of the pulse, etc.), can be used as the basis of one methodology to determine the location of the short circuit within the network 300. In particular, the analysis block 410 may detect the timing differential $\Delta t$ based on the timer output 432 at the generation of a pulse 500 and the receipt of the leading edge or following the edge of the echo pulse 502. Because, generally speaking, electromagnetic waves, such as those associated with the pulse 500, travel at a known speed (the speed of light) down a wire, the distance between the location of the handheld device generating the pulse and the short circuit (that generates the echo pulse) can be determined based on the timing difference between the generation of the pulse 500 and the receipt of the echo pulse 502. In this case, the analysis block 410 can compute that distance based on the timing differential $\Delta t$ and provide an estimated distance to the fault (e.g., down the wire) to assist the user in narrowing down on the location of the fault, such as the open circuit 310 of FIG. 3. The control circuit 415 may then display, via the user interface 104, the calculated distance to the detected fault.

Moreover, if desired, the analysis block 410 may store (in the memory 191 for example) or may be provided with a diagram of the entire network 300 (including where devices are generally located in the network 300 relative to the location at which the handheld device 100 is located on or attached to the network 300). In this case, the analysis block 410 may provide or may illustrate on the user interface display 104 the location of the suspected fault or the general location of the suspected default based on the knowledge of the entire network 300 and the devices thereon. Thus, in this instance, the analysis block 410 may operate to determine the location of a fault vis-à-vis or with respect to other devices that are already connected to or that are known to be on the network 300 based on the timing of the receipt of the echo.

In another example, the analysis block 410 may determine the location of fault, such as an open circuit fault, based on the detected magnitude of the echo pulse 502, as compared to the magnitude of the transmitted pulse 500. In this case, the measurement circuit 402, when detecting an echo pulse 502, may also detect the amplitude of that signal (e.g., voltage signal). The amplifiers 404 and the signal processing block 408 may magnify the measured signal, reduce noise, filter out ripple, etc., and the analog-to-digital convertors 406 may convert the analog signals into digital format to produce a digitized signal that can be analyzed on the analysis block 410 (executed on the processor 190, for example) immediately as the signal comes in, thereby performing on-line processing. In this case, the amplitude of the pulse signal may be characterized in some format from digital values and, preferably, the amplitude of the received pulse signal is converted into a mV (peak-to-peak) format.

In any event, the analysis block 410 may compare the detected amplitude of the received echo pulse signal 502 to the amplitude of the original pulse signal 500 placed onto the network 300 to determine a degradation in the amplitude. For example, the analysis block 410 may determine a difference in the amplitude, a ratio of the amplitudes, etc. The analysis block 410 may store or know the general resistance and propagation properties of the signals on the network 300 and the amount of power necessary to transmit signals through a known distance along the network 300. This information may be determined in a basic or test network and may be stored in the memory 191 of the handheld device 100, or may be estimated based on known electrical signal propagation characteristics, or may instead be determined experimentally for a network 300 by measuring the degradation in a pulse over the network 300 between two known locations on the network 300. Such an experimentally determined value may be determined when the network 300 is known to not have any faults, and may be measured by placing a pulse on the network 300 and receiving an echo pulse from a known termination location on the network (such as a termination point without a terminator connected thereto). With such a system, the difference or the change in the magnitude of the generated pulse and the detected echo pulse can be used to derive or determine a relative distance away from the handheld device 100 at which the fault is located. Still further, if desired, the analysis block 410 may use both or any combination of the magnitude and the time difference methodologies discussed above to determine the location of a fault.

Figure 7:
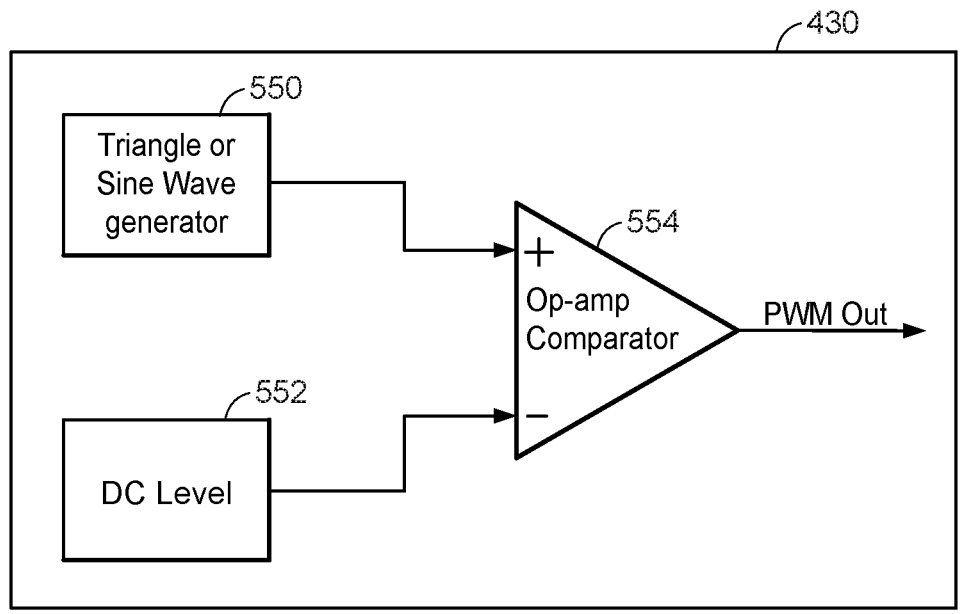
FIG. 7 illustrates a block diagram of an example pulse generation circuit that can be used in the fault detection circuitry of the system of FIG. 5.
Figure 8:
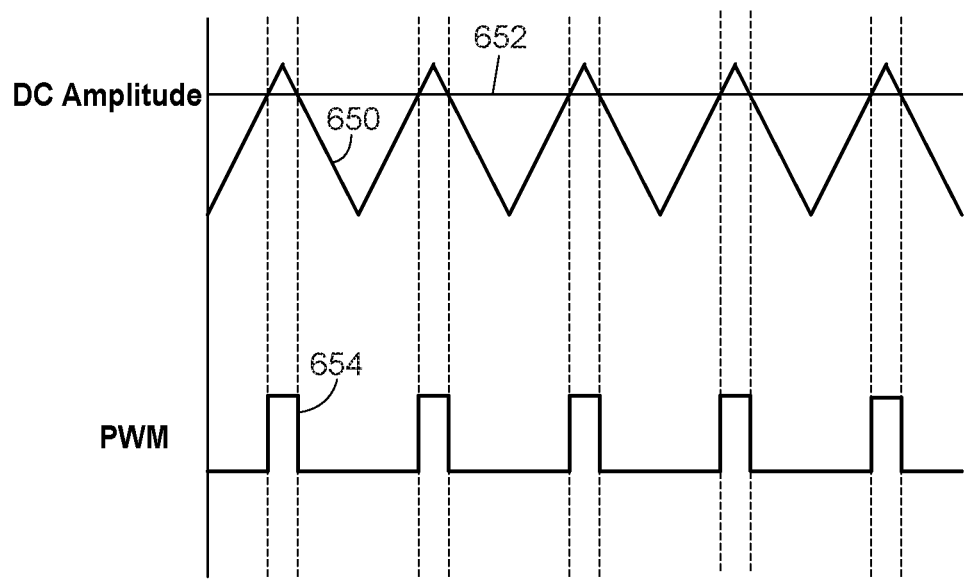
FIG. 8 illustrates a signal diagram associated with a method of generating a pulse signal that may be used by the circuit of FIG. 7.

FIG. 7 illustrates one potential construction of the pulse signal generator 430 illustrated in FIG. 5. In particular, the pulse signal generator 430 may include a triangle signal generator (or a sine wave generator or other ramping or alternating periodic signal) 550 and a DC level voltage signal generator 552, which provide their outputs to the plus and minus inputs of an operational amplifier (op-amp) 554, respectively. Thus, as illustrated in FIG. 7, the positive input of the op-amp 554 receives the output of the triangle or sine wave generator 550 and the negative input of the op-amp 554 receives the output of the DC level 552. During operation, the op-amp 554 produces a pulse width modulated signal output based on the receipt of these two inputs. The duration (and possibly the amplitude) of the created pulses (e.g., the width and amplitude of the pulses) are determined by the level or amplitude of the output of the DC level generator unit 552 and can be changed or varied by changing the amplitude of the DC level generator output. A particular operation of the op-amp 554 is illustrated in FIG. 8 using two signal diagrams. The upper signal diagram in FIG. 8 illustrates an output 650 of the triangle signal generator 550 overlaid with an output 652 of the DC voltage level generator 552. The operational amplifier 554 essentially produces a zero output voltage whenever the signal 650 is lower than the DC level signal 652, and the operational amplifier 554 outputs a positive steady or constant-level voltage whenever the output 650 of the triangle signal generator 550 is greater than the DC level signal 652. The pulse width modulated signal produced by the op-amp 554 is illustrated as the pulse width modulated signal 664 in the lower signal diagram of FIG. 8. The diagrams of FIG. 8 thus illustrate the manner of comparing a ramping waveform 650 with a DC level 652 to produce a pulse width modulated waveform signal needed for diagnostic purposes. As will be understood, increasing the DC level that is used increases the width of the pulses created by the generator 430. The DC level, which is a demand signal, can range between the minimum and maximum voltages of the triangle wave to produce pulses of different widths. As will be seen, when the triangle waveform voltage 650 is greater than the DC level 652, the output 654 of the op-amp 554 swings high, and when the triangle waveform voltage 650 is less than the DC level 652, the output 654 of the op-amp 554 swings low. Of course, the amplitude of the pulses of the pulse width modulated signal 654 can be set at a particular level, may be equal to or may be set by the level of the DC voltage 652, or may be set in any other manner.

Moreover, the use of the operational amplifier 554 to generate pulses on the communication lines enables the control circuit 415 of FIG. 5 to vary the pulse intensity (power or amplitude) of the output pulse to enable the detection of an echo pulse. In particular, the intensity (amplitude) of the echo pulse lessens with the distance this pulse travels from the fault location. Sometimes, the control unit 415 may need to increase the generated electromagnetic pulse intensity or amplitude to thereby increase the intensity of the echo pulse, such as when the control system sends out a first pulse at a first intensity but does not detect an echo pulse in response to the first pulse. The control circuit 415 may iteratively increase the pulse intensity until the control circuit 415 (or the analysis block 408) detects an echo pulse (or until some high level threshold has been reached). In one embodiment, the pulse signal generator 430 may include a series of operational amplifiers to generate an output that can be increased from one minimum level to another maximum level, e.g., from 100 mA to 250 mA. Moreover, as will be understood, the intensity of the echo pulse is inversely proportional to the distance of fault location. The calculation of the coefficient that may be used to calculate the distance to the fault location is dependent mainly on various signal propagation factors associated with the network 300. As an example, the following signal propagation factors may be used for Foundation® Fieldbus lines.

Cable impedance: 100 & ±20%
Attenuation: 3 dB/km
Capacitance to shield: <4 nF/km Similar signal propagation factors may be taken into account for other communication protocols or lines, such as for HART control lines, and the calculated coefficient can be used, along with the determined amplitude degradation to calculate the distance to the fault from the handheld device generating the pulse.

Figure 9:
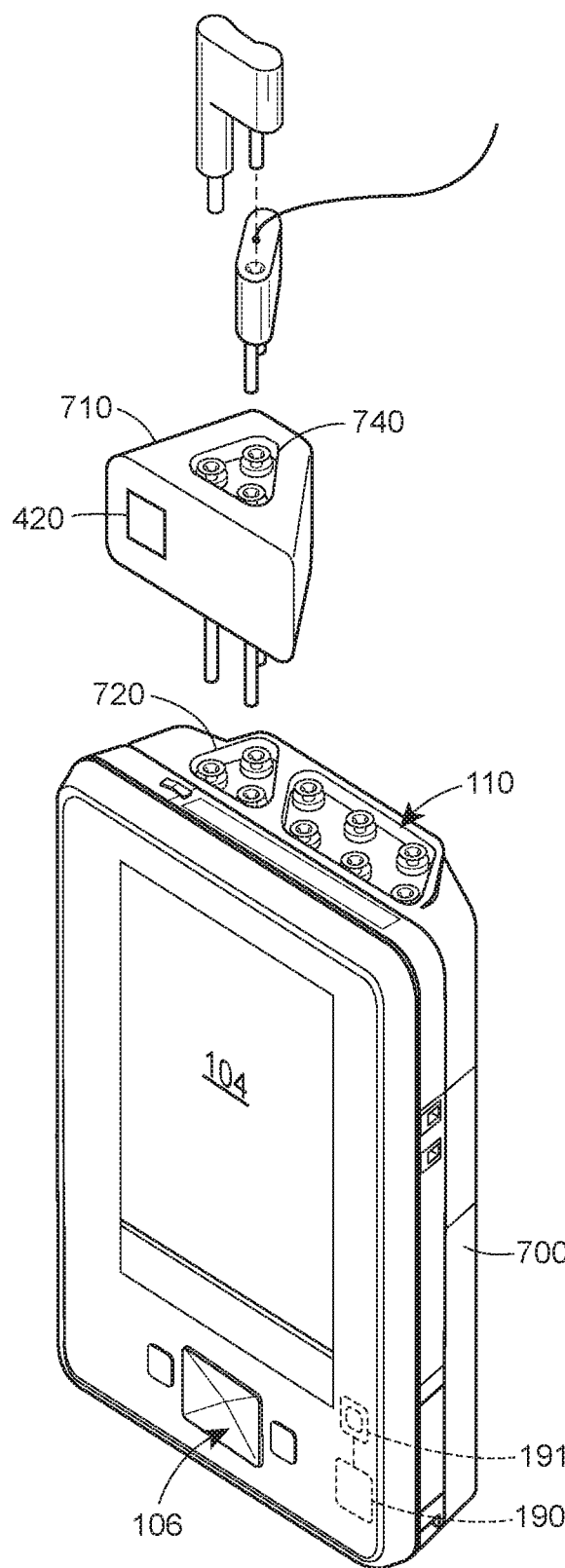
FIG. 9 illustrates a handheld communication and maintenance device having a removably attachable fault detection and fault location detection unit.

FIG. 9 illustrates another example of a handheld device 700 which may include the most of the circuitry and functionality of the handheld device 100 of FIG. 2, but which does not include the pulse signal generator circuit in the same housing. Instead, this circuitry is provided in a separate or second housing or enclosure 710 which may be removably connected to the first housing of the device 700 via, for example, pins which couple to inputs on the input/ output interface 720 (which may be part of the interface 110 of FIG. 2) of the device 700. In particular, the pulse signal generation circuitry 420, as illustrated in, for example, FIG. 5, as well as potentially all or parts of the measurement block 402, the amplifiers 404, the signal processing block 408, and the analysis block 410 of FIG. 5 may be disposed within the enclosure 710 and may be connected to the processor 410 of the device 700 via connections that connect through the input/output interface 720 of the handheld device 700. If desired, the pulse generator circuit 420 may be powered by a separate battery within the enclosure 710 or may be powered by the battery within the handheld device 700. The use of the separate enclosure 710 to encase or hold the pulse generator circuit 430 is desirable in some cases because the pulse width generator circuitry 430 may not be suitable for use in an intrinsically safe environment, due to the fact that the pulse generator circuit 430 may generate pulses over a particular voltage level, which might induce or could lead to potential sparks. As such, when the pulse generator circuit 430 is disposed in a separate housing or module 710, the module 710 may be removed from the housing of the device 700, as desired, so that the handheld device 700 may be used in an intrinsically safe environment without the pulse signal generation circuitry 430. However, the pulse generation functionality may be added to the diagnostic capabilities of the device 700 when needed in, for example, a non-intrinsically safe environment, simply by connecting the module 710 onto the device 700 via the input/output connections 720. Of course, if desired, the module 710 may include a separate input/output interface 740, which may provide a standard connection interface to a field device or to a network, such as the network 300 using any standard or known interface connection circuitry. In this case, the device 710 may provide all of the signals or have all of the connections that are necessary to connect the device 700 to the network 300 or to field devices within the network 300, so as to make a complete diagnostic system including a pulse signal generator 430 which may be used to determine locations of faults within the network 300. In another embodiment, the module 710 may connect to the device 700 via separate or dedicated input/output connections designed to enable the pulse generator circuit 430 to be integrated into the diagnostic capabilities of the device 700, but the input/output connections to the network 300 or to field devices within the network 300 may be provided via other input/output connections 110 on the device 700. In other cases, the power output by (or maximum voltage level of) the pulse generator circuit 430 may be limited to that acceptable in an intrinsically safe environment to enable the pulse signal generator 430 to be used in an intrinsically safe manner.

In any event, the use of the block 710 makes it easily visible to the user whether or not the pulse signal generation circuitry 430, and thus the fault location detection circuitry associated therewith, is being used with the device 700. This indication makes it easy to understand whether or not the device 700 includes the pulse generation functionality, when being used, and thus makes it easily determinable whether or not the handheld device 700 can be used in an intrinsically safe environment. Still further, if desired, all of the fault detection circuitry and functionality described herein, including the fault detection and location functionality and components as described herein, may be provide in the removable module 710 to make the handheld device 700 convertible from a typical device to one that includes fault detection and fault location determination functionality.

Still further, it will be understood that the pulse signal generation circuitry 430 may use a significant amount of battery power to produce the pulses needed to perform fault location detection. As such, the control circuitry 415 may track a status indication of the battery (e.g., the battery 440 of FIG. 5) with respect to the use of the pulse generator functionality. For example, the control circuitry 415 may track the number of times that the pulse signal generation circuitry 430 operates, e.g., the number of pulses generated on one battery charge, the length of time the pulse generation circuitry 430 has been used, etc., to determine, at least in a gross manner, the amount of battery power left to perform diagnostics or some other status indicator of the battery. In other cases, the control circuitry 415 may monitor battery charge directly to determine the amount of battery power left in the battery 440 at any particular time and may operate to estimate the number of times or number of pulses that can be generated on this charge as a status indication. The control circuitry 415 may, for example, provide an indication of the number of times that the user can use the pulse generator 430 to detect fault locations before depleting the battery or may warn the user if using the pulse signal generator 430 may result in depletion or near depletion of the battery 440.

Thus, as described above, a handheld maintenance tool operates to detect the existence of a fault in a communication line or bus, and additionally to detect a location or approximate location of the fault. The handheld maintenance tool may detect various types of line or communication network faults, such as short circuit or other low impedance faults, and open circuits or other high impedance faults. Additionally, the handheld maintenance tool may detect an approximate location of a fault to enable an operator or maintenance person to more easily find and repair the fault.

Although the forgoing text sets forth a detailed description of numerous different embodiments, it should be understood that the scope of the patent is defined by the words of the claims set forth at the end of this paper. The detailed description is to be construed as exemplary only and does not describe every possible embodiment. Further, while FOUNDATION® Fieldbus and HART type of field devices connections have been specifically referenced, the described assembly and devices may be used on other process control systems and field device and communication bus types. Numerous alternative embodiments could be implemented, using either current technology or technology developed after the filing date of this paper, which would still fall within the scope of the claims.

Thus, many modifications and variations may be made in the techniques and structures described and illustrated herein without departing from the spirit and scope of the present claims. Accordingly, it should be understood that the methods and apparatus described herein are illustrative only and are not limiting upon the scope of the claims.

What is claimed is:

1. A method of detecting the location of a fault in a process control network communication bus of a process control system of a process plant, comprising:

generating a pulse signal on at least one communication line via a handheld device connected to the communication line at a first time, the communication line included in the process control network communication bus and communicatively coupled between process control devices of the process control system that are installed in a process control network of the process plant, wherein the process control devices include a process controller and a field device, wherein the process controller, when fully operational and communicatively coupled via the communication line, operate to receive signals indicative of process measurements made by the field device or information pertaining to the field device and generate control signals that are sent over the communication line to control operation of the field device and a process within the process plant;

detecting an echo pulse signal on the communication line at the handheld device at a second time, the echo pulse signal being a reflection of the pulse signal at the fault;

determining, via a computer processor in the handheld device, the location of the fault on the communication line based on the detected echo pulse signal; and displaying the determined location of the fault in relation to a location of at least one of the process control devices via a user interface of the handheld device based on knowledge of the process control network.

2. The method of detecting the location of a fault in a process control network of claim 1, wherein determining the location of the fault includes determining a time differential between the first time and the second time, and using the time differential to determine a distance to the fault.

3. The method of detecting a location of a fault in a process control network of claim 1, wherein determining the location of the fault on the communication line includes determining an amplitude of the detected echo pulse signal and using the determined amplitude of the detected echo pulse signal to determine a distance to the fault.

4. The method of detecting a location of a fault in a process control network of claim 3, wherein using the determined amplitude of the detected echo pulse signal to determine a distance to the fault includes comparing the amplitude of the detected echo pulse signal to the amplitude of the pulse signal to determine a degradation in amplitude and using the degradation in amplitude to determine a distance to the fault.

5. The method of detecting a location of a fault in a process control network of claim 4, wherein using the determined amplitude of the detected echo pulse signal to determine a distance to the fault includes storing one or more signal propagation factors in a memory of the handheld device and using the one or more stored signal propagation factors in addition to the degradation in amplitude to determine a distance to the fault.

6. The method of detecting a location of a fault in the process control network of claim 1, wherein generating a pulse signal on the communication line includes generating a first pulse signal on the communication line having a first amplitude, detecting whether or not an echo pulse signal is received in response to the first pulse signal in a particular period of time, and if no echo pulse signal is received in the particular period of time, generating a second pulse signal on the communication line having a second amplitude greater than the first amplitude, and detecting whether or not an echo pulse signal is received in response to the second pulse signal in a second period of time.

7. The method of detecting a location of a fault in a process control network of claim 1, further including tracking battery usage of the handheld device caused by generating the pulse signal and alerting a user of the handheld device about a power status relating to use of a pulse signal generator within the handheld device for detecting a fault location.

8. A handheld maintenance tool for use detecting faults in a process control network communication bus of a process control system of a process plant, comprising:

an input/output interface configured to connect to at least one communication line that is included in the process control network communication bus and communicatively coupled between process control devices of the process control system that are installed in a process control network of the process plant, wherein the process control devices include a process controller and a field device, wherein the process controller, when fully operational and communicatively coupled via the communication line, operate to receive signals indicative of process measurements made by the field device or information pertaining to the field device and generate control signals that are sent over the communication line to control operation of the field device and a process within the process plant;

a pulse signal generator configured to generate a pulse signal to be placed on the communication line;

one or more electronic signal sensors;

a processor;

a computer readable memory that stores a program to be implemented on the processor to measure an electronic signal on the communication line in response to the pulse signal on the communication line, to analyze the measured electronic signal to determine a location of a fault in the communication line and to indicate the existence of the determined location of the fault to a user via the user interface; and a user interface that displays the determined location of the fault in relation to a location of at least one of the process control devices based on knowledge of the process control network.

9. The handheld maintenance tool of claim 8, wherein the one or more electronic signal sensors includes a voltage sensor that detects an echo pulse signal on the communication line.

10. The handheld maintenance tool of claim 8, wherein the program further causes the pulse signal generator to place a pulse signal on the communication line at a first time, uses the one or more electronic signal sensors to detect an echo pulse signal on the communication line at the handheld device at a second time, the echo pulse signal being a reflection of the pulse signal at the fault, and uses the echo pulse signal to determine the location of the fault on the communication line.

11. The handheld maintenance tool of claim 10, wherein the program uses the echo pulse signal to determine the location of the fault on the communication line by determining a time differential between the first time and the second time and using the time differential to determine a distance to the fault.

12. The handheld maintenance tool of claim 10, wherein the program determines an amplitude of the echo pulse signal and uses the determined amplitude of the pulse signal to determine a distance to the fault.

13. The handheld maintenance tool of claim 12, wherein the program compares the amplitude of the detected echo pulse signal to the amplitude of the pulse signal to determine a degradation in amplitude and uses the degradation in amplitude to determine a distance to the fault.

14. The handheld maintenance tool of claim 10, wherein the program tracks battery usage of the handheld device caused by generating the pulse signal and alerts a user of the handheld device via that user interface regarding a power status relating to use of the pulse signal.

15. The handheld maintenance tool of claim 8, including a first housing and a second housing that is removably connected to the first housing, wherein the processor, the one or more electronic signal sensors, and the user interface are disposed in the first housing, and wherein the pulse signal generator is disposed in the second housing.

16. A method of detecting a fault in a process control network of a process control system of a process plant, comprising:
providing a first power signal on at least one communication line at a first amplitude level from a handheld device connected to the communication line, the communication line included in the process control network and communicatively coupled between process control devices of the process control system that are installed in a process control network of the process plant, wherein the process control devices include a process controller and a field device, wherein the process controller, when fully operational and communicatively coupled via the communication line, operate to receive signals indicative of process measurements made by the field device or information pertaining to the field device and generate control signals that are sent over the communication line to control operation of the field device and a process within the process plant;
measuring a current on the communication line in response to the first power signal on the communication line at the handheld device;
analyzing the measured current signal via a processor within the handheld device to determine the existence of a low impedance fault in the communication line in response to the first power signal;
if a low impedance fault condition is not determined in response to the first power signal on the communication line,
(1) providing a second power signal on the communication line at a second amplitude level higher than the first amplitude level;
(2) measuring a further current signal on the communication line in response to the second power signal on the communication line; and
(3) analyzing the measured further current signal to determine the existence of a low impedance fault in the communication line; and
if a low impedance fault is determined for either of the first power signal or the second power signal, displaying a location of a detected fault in relation to a location of at least one of the process control devices to a user via a user interface on the handheld device based on knowledge of the process control network.

17. The method of detecting a fault in a process control network of claim 16, further including removing the first power signal or the second power signal from the communication line if a low impedance fault is determined for either of the first power signal or the second power signal.

18. The method of detecting a fault in a process control network of claim 16, wherein analyzing the measured current signal to determine the existence of a low impedance fault in the communication line in response to the first power signal includes determining if the measured current signal is higher than a threshold.

19. The method of detecting a fault in a process control network of claim 16, wherein analyzing the measured current signal to determine the existence of a low impedance fault in the communication line in response to the first power signal includes determining if the measured current signal is higher than a first threshold and wherein analyzing the measured further current signal to determine the existence of a low impedance fault in the communication line in response to the second power signal includes determining if the measured further current signal is higher than a second threshold, wherein the second threshold is greater than the first threshold.

20. The method of detecting a fault in a process control network of claim 16, further including storing an indication of an expected current draw from the at least one of the process control devices on the communication line in a memory of the handheld device and wherein analyzing the measured current signal to determine the existence of a low impedance fault in the communication line in response to the first power signal includes determining if the measured current signal is higher than a first threshold derived from the indication of an expected current draw from the at least one of the process control devices on the communication line.

21. The handheld maintenance tool of claim 15, wherein the pulse signal generator is powered by a battery within the handheld device.

22. The handheld maintenance tool of claim 21, wherein the battery is within the first housing.

23. The handheld maintenance tool of claim 21, wherein the battery is within the second housing.

24. A method of detecting a location of a fault in a process control network communication bus of a process control system of a process plant, comprising:
generating a pulse signal on at least one communication line via a pulse signal generator of a handheld device connected to the communication line at a first time, the handheld device including a first housing and a second housing that is removably connected to the first housing, the pulse signal generator disposed in the second housing and powered by a battery within the handheld device, the communication line included in the process control network communication bus and communicatively coupled between process control devices of the process control system that are installed in the process plant, wherein the process control devices include a process controller and a field device, wherein the process controller, when fully operational and communicatively coupled via the communication line, operate to receive signals indicative of process measurements made by the field device or information pertaining to the field device and generate control signals that are sent over the communication line to control operation of the field device and a process within the process plant;
detecting an echo pulse signal on the communication line at the handheld device at a second time, the echo pulse signal being a reflection of the pulse signal at the fault; and
determining, via a computer processor in the handheld device, the location of the fault on the communication line based on the detected echo pulse signal; and
displaying the location of the detected fault in relation to a location of at least one of the process control devices to a user via a user interface on the handheld device based on knowledge of the process control network.

25. The method of detecting a location of a fault in a process control network of claim 1, wherein the battery is within the second housing.

* * * * *

UNITED STATES PATENT AND TRADEMARK OFFICE
CERTIFICATE OF CORRECTION

PATENT NO. : 11,368,384 B2
APPLICATION NO. : 16/451453
DATED : June 21, 2022
INVENTOR(S) : Mehul Rajeshbhai Dalal Page 1 of 2

It is certified that error appears in the above-identified patent and that said Letters Patent is hereby corrected as shown below:

On the Title Page

At item (56), Line 12, "Ltd," should be -- Ltd., --.

At page 3, in Column 1, item (56), under "OTHER PUBLICATIONS", Line 2, "Pepperla" should be -- Pepperl --.

At page 3, in Column 1, item (56), under "OTHER PUBLICATIONS", Line 4, "/qlobal/" should be -- /global/ --.

At page 3, in Column 1, item (56), under "OTHER PUBLICATIONS", Line 13, "foundation-fieldbus.pdf>." should be -- foundation_fieldbus.pdf>. --.

At page 3, in Column 1, item (56), under "OTHER PUBLICATIONS", Line 18, ""Tiem" should be -- "Time --.

At page 3, in Column 1, item (56), under "OTHER PUBLICATIONS", Line 27, "(Retreived" should be -- Retrieved --.

At page 3, in Column 1, item (56), under "OTHER PUBLICATIONS", Line 31, "Essential Concepts" should be -- Essential_Concepts --.

At page 3, in Column 2, item (56), under "OTHER PUBLICATIONS", Line 59, "Combind" should be -- Combined --.

In the Specification

At Column 1, Line 12, "2016," should be -- 2016, now Pat. No. 10,382,312, --.

At Column 4, Line 31, "use" should be -- user --.

Signed and Sealed this
Sixteenth Day of December, 2025

John A. Squires
*Director of the United States Patent and Trademark Office*

CERTIFICATE OF CORRECTION (continued)
U.S. Pat. No. 11,368,384 B2

At Column 5, Line 63, "the using" should be -- using --.

At Column 6, Line 1, "the using" should be -- using --.

At Column 9, Lines 3-12, "Still further, the method of detecting……devices on the communication line." should be at Line 2, after "greater than the first threshold." as a continuation paragraph.

At Column 11, Line 66, "the control" should be -- control --.

At Column 12, Line 7, "user" should be -- user. --.

At Column 12, Line 64, "or are" should be -- or --.

At Column 14, Line 5, "FIG. 5)" should be -- FIG. 5). --.

At Column 15, Line 63, "an short" should be -- a short --.

At Column 16, Line 28, "controlled" should be -- controlled and --.

At Column 16, Line 52, "(FIG. 2)" should be -- (FIG. 2). --.

At Column 18, Line 23, "between from" should be -- between --.

At Column 21, Line 62, "provide" should be -- provided --.

In the Claims

At Column 26, Lines 52-53, "fault; and" should be -- fault; --.